United States Patent

Inohara et al.

[11] Patent Number: 5,966,634
[45] Date of Patent: Oct. 12, 1999

[54] METHOD OF MANUFACTURING SEMICONDUCTOR DEVICE HAVING MULTI-LAYER WIRING STRUCTURE WITH DIFFUSION PREVENTING FILM

[75] Inventors: Masahiro Inohara, Tokyo; Minakshisundaran Balasubramanian Anand; Tadashi Matsuno, both of Yokohama, all of Japan

[73] Assignee: Kabushiki Kaisha Toshiba, Tokyo, Japan

[21] Appl. No.: 08/823,955

[22] Filed: Mar. 25, 1997

[30] Foreign Application Priority Data

Mar. 25, 1996 [JP] Japan ................................ 8-067627

[51] Int. Cl.$^6$ ................................................ H01L 21/316
[52] U.S. Cl. .......................... 438/687; 438/618; 438/622; 438/624; 438/625; 438/627; 438/634; 438/637; 438/639; 438/643; 438/666; 438/668; 438/672; 438/675; 438/678; 438/695
[58] Field of Search ..................................... 438/687, 618, 438/622, 624–630, 634, 637–643, 666, 668–675, 678, 688, 690, 695–697, 700–703

[56] References Cited

U.S. PATENT DOCUMENTS 5,071,518  12/1991  Pan .......................................... 205/122
5,281,850  1/1994  Kanamori .
5,413,962  5/1995  Lur et al. ................................. 438/624
5,472,913  12/1995  Havemann et al. ..................... 438/703
5,506,177  4/1996  Kishimoto et al. ..................... 438/624
5,818,110  11/1998  Cronin .................................... 438/660

FOREIGN PATENT DOCUMENTS 2082771    5/1994   Canada .
571108 A1  11/1993  European Pat. Off. .

Primary Examiner—Charles Bowers
Assistant Examiner—Thanh Nguyen
Attorney, Agent, or Firm—Loeb & Loeb LLP

[57] ABSTRACT

In a method of manufacturing a semiconductor device, when a copper diffusion preventing film portion on the connecting hole bottom portion is to be removed, a film thickness of other portion of the copper diffusion preventing film not to be removed is more thickly formed than that of the to-be-removed copper diffusion preventing film portion on the connecting hole bottom portion, thereby only the copper diffusion preventing film portion to be removed can be removed. The method can extend a durable length of time of a wire and can reduce a resistance of the metal wires in a connecting hole bottom portion by removing a copper diffusion preventing film on the bottom portion of the connecting hole.

43 Claims, 10 Drawing Sheets

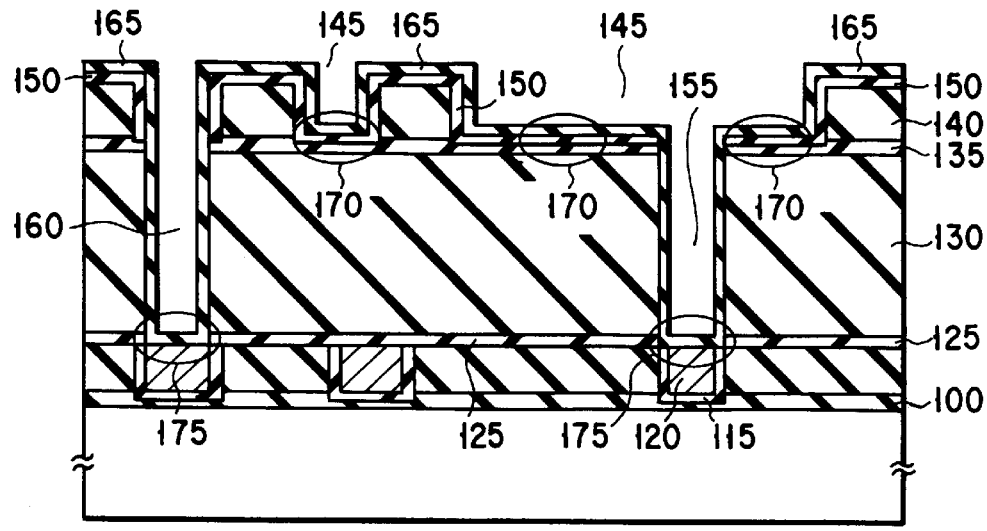
F I G. 4
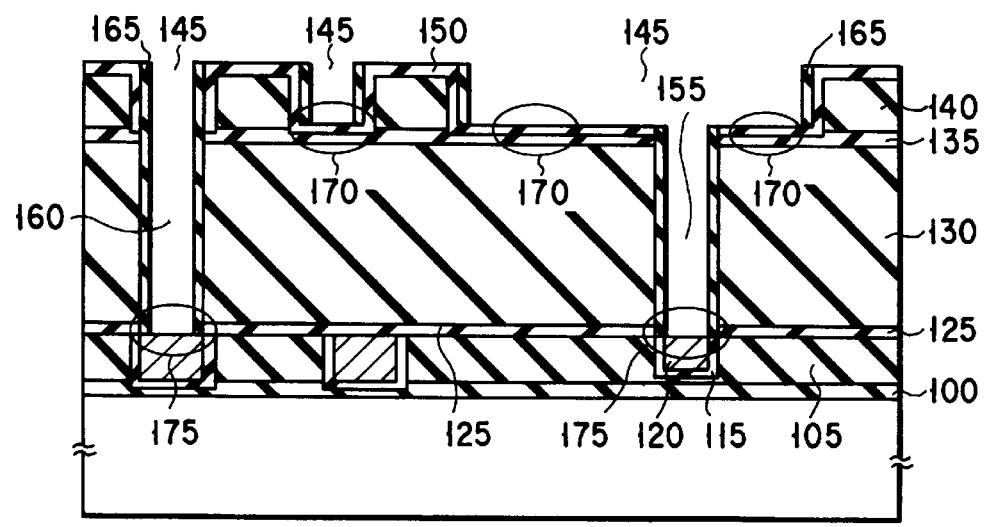
F I G. 5
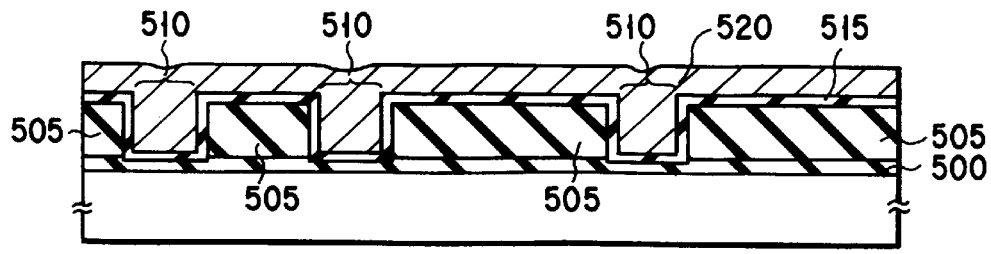
F I G. 6

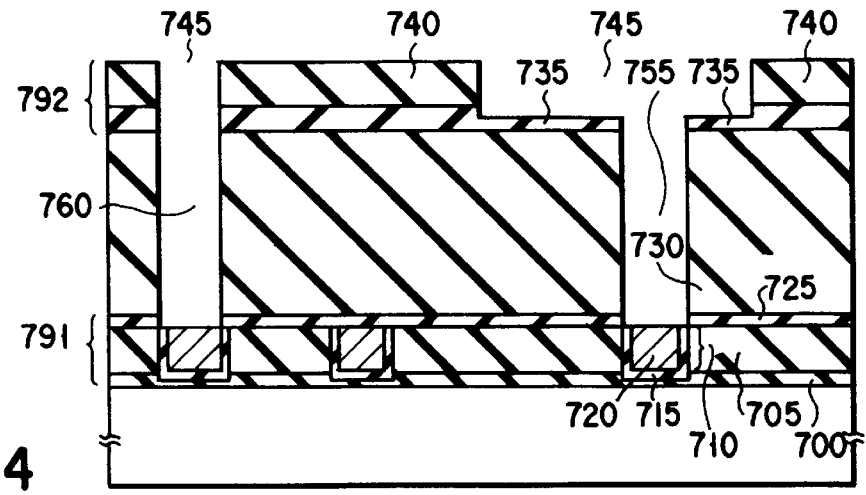
F I G. 14
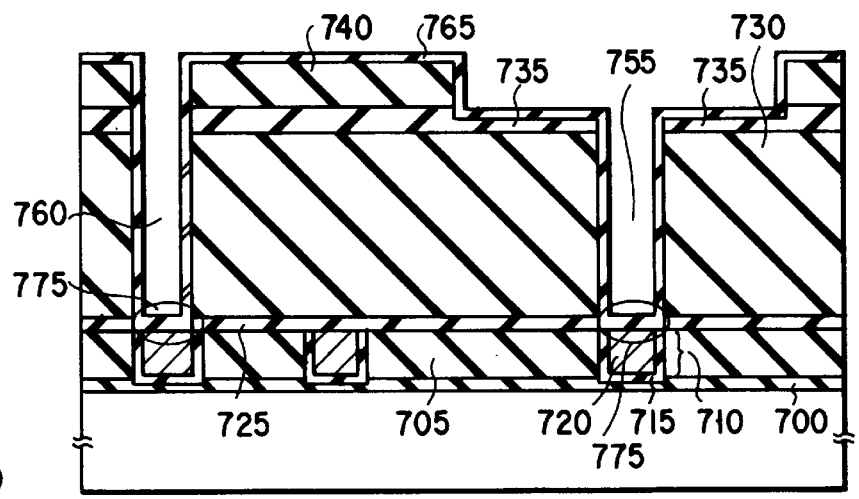
F I G. 15
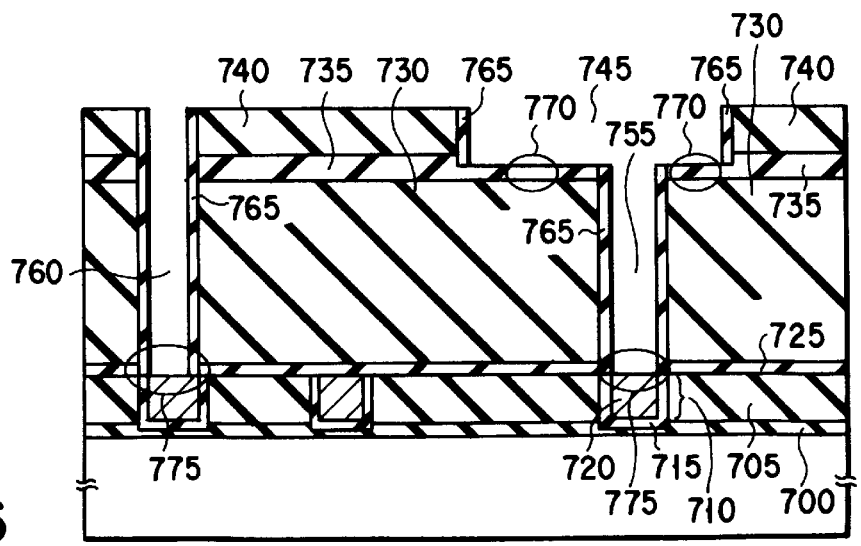
F I G. 16

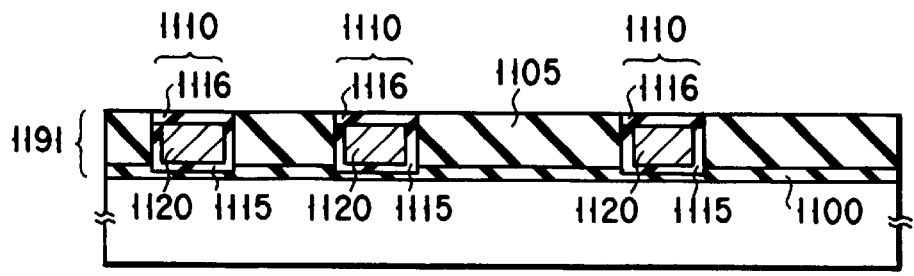
F I G. 17
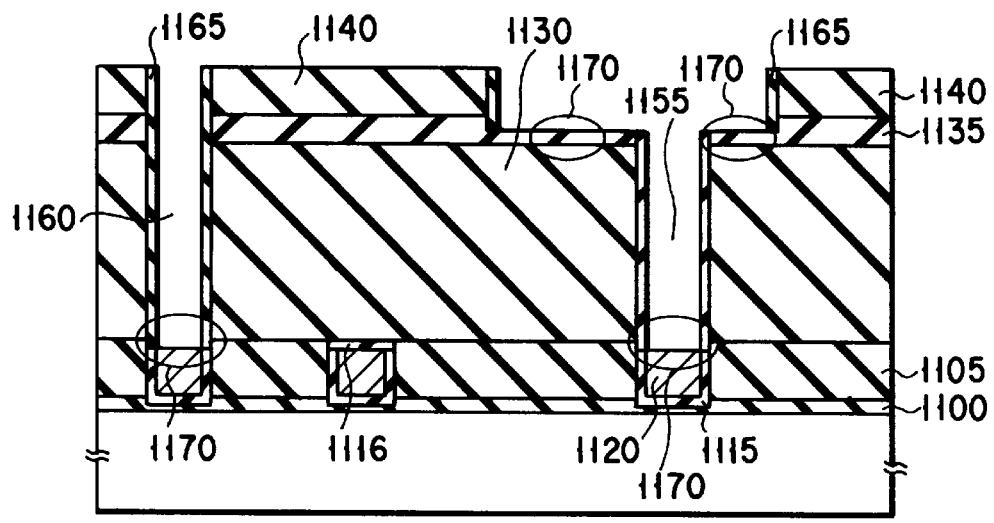
F I G. 18
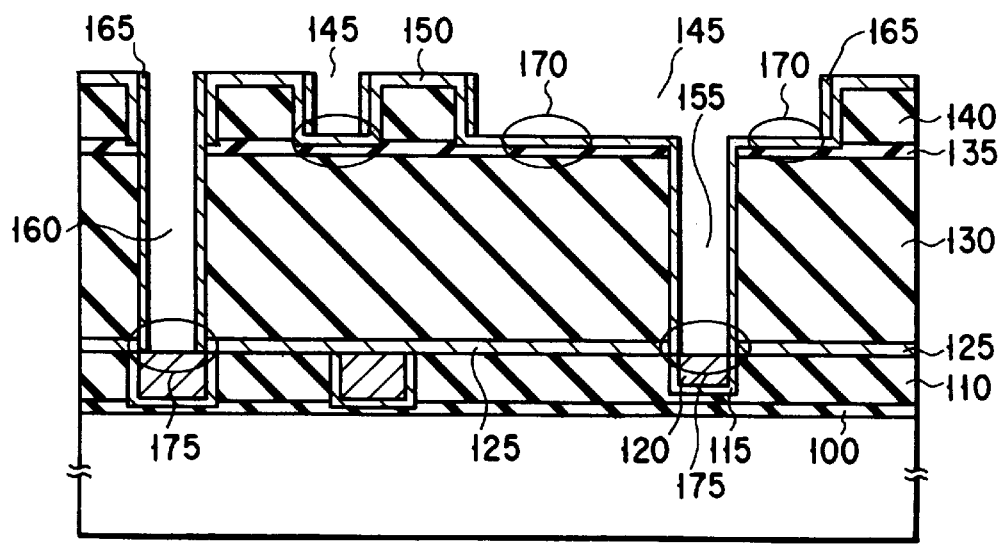
F I G. 19

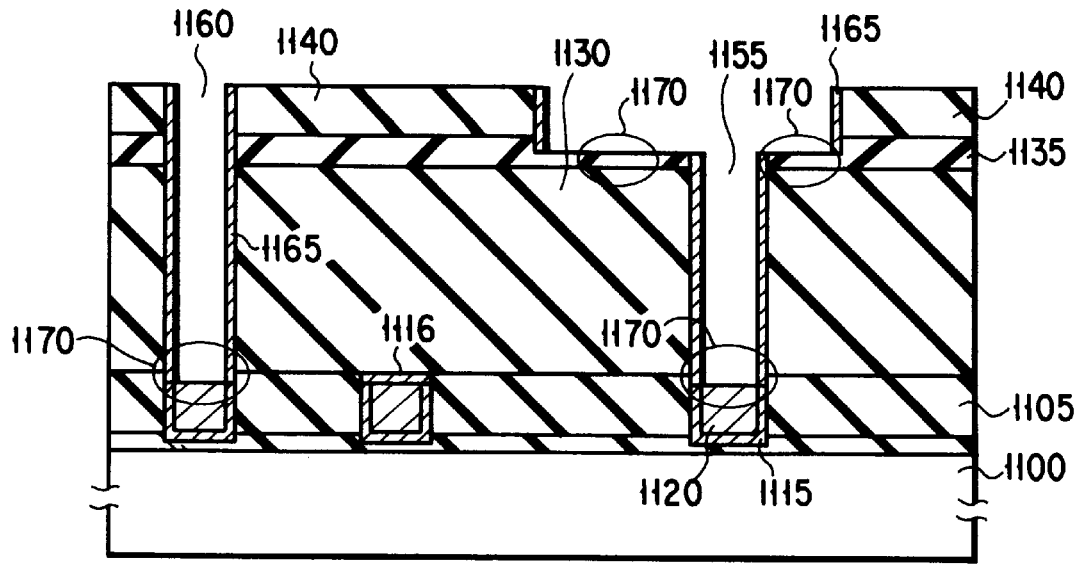
F I G. 22
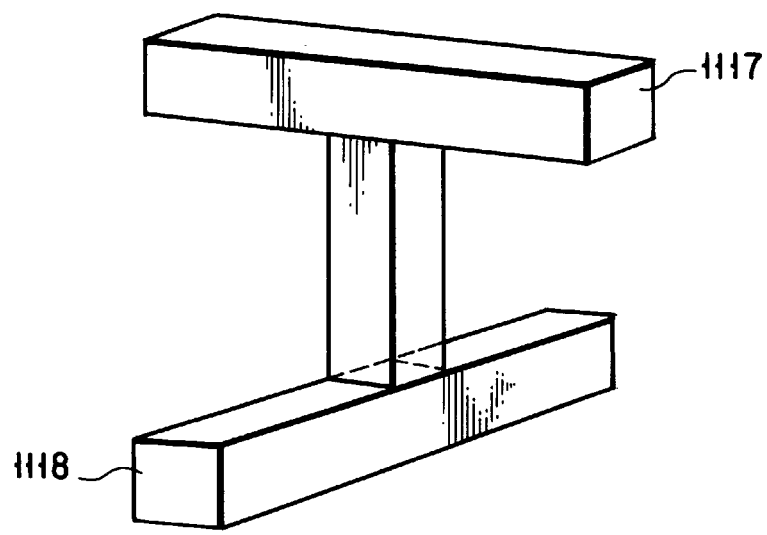
F I G. 23 ically connecting a first copper wire and a second copper wire formed in different layers of a multi-layer wire structure on a substrate to each other comprising: a step of forming the first copper wire whose periphery is covered with a first copper diffusion preventing film; a step of forming an interlayered insulating film having a wiring groove on the first copper wire; a step of forming a second copper diffusion preventing film on a surface of the interlayered insulating film; a step of forming a connecting hole extended from a bottom portion of the wiring groove to the first copper wire; a step of forming a third copper diffusion preventing film at the bottom portion and a side surface of the wiring groove and at a bottom portion and a side surface of the connecting hole; a step of removing the third copper diffusion preventing film portion on the connecting hole bottom portion to expose the first copper wire by using an anisotropic etching, while remaining the third copper diffusion preventing film portion on the side surfaces of the wiring groove and the
METHOD OF MANUFACTURING SEMICONDUCTOR DEVICE HAVING MULTI-LAYER WIRING STRUCTURE WITH DIFFUSION PREVENTING FILM

BACKGROUND OF THE INVENTION

The present invention relates to a method of manufacturing a semiconductor device of a multi-layer wire structure. More specifically, the present invention relates to a method of removing an undesired film formed between a metal wire in an upper-layered wiring structure and a metal wire in a lower-layered wiring structure at a bottom portion of a contact hole through which the metal wires of the upper-layered wiring and the lower-layered wiring are connected to each other.

In a method of manufacturing a semiconductor device of a multi-layer wire structure, a metal wire in an upper-layered wiring structure and a metal wire in a lower-layered wiring structure are connected to each other at a bottom portion of a contact hole. However, during the manufacturing process, an undesired film is formed between the metal wire in the upper-layered wiring structure and the metal wiring layer in the lower-layered wiring structure. Such an undesired film is, when the metal wires are made of copper, a copper diffusion preventing film for preventing copper atoms from being diffused from the copper wires into an insulation film formed adjacent to the copper wires, or when the metal wires are made of aluminium, a film for increasing reflow of aluminium or reliability of aluminium wire for long-term use.

Prior art will be explained in detail by using FIGS. 24 to 27 of the accompanying drawings, in a case where the metal wires are made of copper, and the undesired film is a copper diffusion preventing film for preventing copper atoms from being diffused from the copper wires.

FIG. 24 shows a semiconductor device of a multi-layer wire structure. FIG. 25 shows a cross-sectional view of the semiconductor device shown in FIG. 24. Copper diffusion preventing films 1211 and 1212 are formed around a metal wire 1201 formed in a lower-layered wiring structure 1291. The diffusion preventing films 1211 and 1212 are made of for example, silicon nitride and prevent copper atoms from diffusing into interlayered insulating films 1221 and 1292. Without the copper diffusion preventing films, the copper atoms will be flowed into the interlayered insulating films from being diffused from the copper wires, thereby a characteristic of a transistor is deteriorated. Accordingly, when the copper is used as a wire material, the copper diffusion preventing film is essential.

Next, as shown in FIG. 26, a copper diffusion preventing film 1213 made of silicon nitride is formed over the semiconductor structure shown in FIG. 25. Thereafter, the wire material whose main component is the copper is embedded in connecting holes 1205, 1206 formed in an interlayered insulating film 1292 and wire grooves 1294 formed in an upper-layered wiring structure 1293, thereby a semiconductor device having a multi-layer wire structure is manufactured.

Furthermore, FIG. 27 is an enlarged cross-sectional view showing a portion near the connecting hole 1205 of the semiconductor structure in which a wire material 1200 whose main component is the copper is embedded in the connecting holes and the wire groove of the semiconductor device shown in FIG. 26. As shown in FIG. 27, the copper diffusion preventing film exists at a bottom portion 1299 of the connecting hole 1205. A copper diffusion rate is extremely slow in the copper diffusion preventing film. Accordingly, when a current I1 is flowed through the wires 1200 and 1201 in the connecting hole 1205 as shown in FIG. 27, the copper diffusion preventing film portion prevents a movement of the copper atoms occurred due to the flow of the current, to cause a void (such a phenomenon that the wire material is moved in the wire, thereby a space is formed in the wire) and a hillock (such a phenomenon that the wire material is overflowed out the wire). Since the void and the hillock may often cause disconnection of the wires, a durable length of time of the wire is reduced. Furthermore, when a resistivity of the copper diffusion preventing film is more than that of the metal wires 1200 and 1201 whose main component is the copper, an equivalent resistance of the wires in the connecting hole 1205 is increased.

As described above, when the metal wire whose main component is the copper is used for the semiconductor device having the multi-layer wire structure, the copper diffusion preventing film for preventing the copper atom contained in the metal wire from diffusing therearound must be formed around the metal wire. However, in case of the wire structure as described above, the copper diffusion preventing film causes the disconnection of the wires due to an electromigration and a resistance increase of the wires at the connecting hole portion.

BRIEF SUMMARY OF THE INVENTION

It is an object of the present invention to provide a method of manufacturing a semiconductor device which can prevent the disconnection of the wires near the connecting hole and can prevent increase of the resistance of the wires in the contact hole.

In order to achieve the above object, the present invention is characterized by that when films at undesired portions, bottom of connecting hole, are removed by using an anisotropic etching method without using a mask material, a thickness of films at portions not to be removed are thickened more than that of films at undesired portions, thereby only the undesired film portion to be removed is removed.

According to the present invention, since films at portions not to be removed are remained and films only at undesired portions, bottom of connecting holes, can be removed, it is possible to solve the disconnection of the wire occurred by the electromigration and the resistance increase of the wire at the connecting hole portion due to an existence of the undesired film at the bottom portion of the connecting hole.

According to the present invention, there is provided a method of manufacturing a semiconductor device for electrically connecting a first copper wire and a second copper wire formed in different layers of a multi-layer wire structure on a substrate to each other comprising: a step of forming the first copper wire whose periphery is covered with a first copper diffusion preventing film; a step of forming an interlayered insulating film having a wiring groove on the first copper wire; a step of forming a second copper diffusion preventing film on a surface of the interlayered insulating film; a step of forming a connecting hole extended from a bottom portion of the wiring groove to the first copper wire; a step of forming a third copper diffusion preventing film at the bottom portion and a side surface of the wiring groove and at a bottom portion and a side surface of the connecting hole; a step of removing the third copper diffusion preventing film portion on the connecting hole bottom portion to expose the first copper wire by using an anisotropic etching, while remaining the third copper diffusion preventing film portion on the side surfaces of the wiring groove and the connecting hole; and a step of forming the second copper wire which is electrically connected to the first copper wire by embedding a copper material in the wiring groove and the connecting hole, whereby the first copper wire and the second copper wire are directly connected to each other not via the third copper diffusion preventing film portion on the contact hole bottom portion, while the copper material in the connecting hole is covered with the third copper diffusion preventing film portion on the side surface of the wiring groove. The copper diffusion preventing film may be a selected one from a group of amorphous titanium SiN, amorphous tungsten SiN, titanium nitride, tungsten, tantalum, niobium, and tantalum aluminium.

According to the present invention, there is further provided a method of manufacturing a semiconductor device for electrically connecting a first copper wire and a second copper wire formed in different layers of a multi-layer wire structure formed via respective insulating films on a substrate to each other comprising: a step of forming the first copper wire whose periphery is covered with a first copper diffusion preventing film; a step of sequentially forming a first interlayered insulating film on the first copper wire and a second copper diffusion preventing film having an opening and a second interlayered insulating film having a wiring groove within a region where a connecting hole is to be formed; a step of forming the connecting hole extended from a bottom portion of the wiring groove to the first copper wire via the opening of the second copper diffusion preventing film; a step of forming a third copper diffusion preventing film at the bottom portion and on a side surface of the wiring groove and at a bottom portion and on a side surface of the connecting hole; a step of removing the third copper diffusion preventing film portion on the connecting hole bottom portion to expose the first copper wire by using the anisotropic etching, while remaining the third copper diffusion preventing film portion on the side surfaces of the wiring groove and the connecting hole; and a step of forming the second copper wire which is electrically connected to the first copper wire by embedding the copper material in the wiring groove and the connecting hole, whereby the first copper wire and the second copper wire are directly connected to each other not via the third copper diffusion preventing film portion on the contact hole bottom portion, while the copper material in the connecting hole is covered with the third copper diffusion preventing film on the side surface of the contact hole. The copper diffusion preventing film may be a selected one from a group of amorphous titanium SiN, amorphous tungsten SiN, titanium nitride, tungsten, tantalum, niobium, and tantalum aluminium.

According to the present invention, there is still further provided a method of manufacturing a semiconductor device comprising: a step of forming a first metal wire having a first wire material whose periphery is covered with a first wire material diffusion preventing film via an insulating layer on a semiconductor substrate; a step of forming a first interlayered insulating film, an etching stopper film and a second interlayered insulating film having an insulation characteristic on the first metal wire; a step of forming a first wiring groove in the second interlayered insulating film, and forming a second wire material diffusion preventing film on an upper surface of the second interlayered insulating film and on an inner surface of the first wiring groove; a step of removing the second wire material diffusion preventing film portion at a bottom portion of the first wiring groove, the etching stopper film and the first wire material diffusion preventing film portion covering an upper surface of the first interlayered insulating film and the first metal wire, to expose the first metal wire, thereby forming an connecting hole; a step of forming a third wire material diffusion preventing film on a surface of the second wire material diffusion preventing film, on an inner side surface of the connecting hole and on an upper surface of the first metal wire; a step of removing the third wire material diffusion preventing film portion on the upper surface of the first metal wire, while remaining the third wire material diffusion preventing film portion on the side surface of the connecting hole and on the side surface of the first wiring groove; and a step of embedding a second metal wire in the connecting hole and the first wiring groove. The step of forming the wire layer may comprise: a sub-step of forming a second wiring groove in a third interlayered insulating film by using the lithography method and the anisotropic etching method; a sub-step of forming a first wire material whose only surface contacted to the second wiring groove of the first wire material is covered with a third wire material diffusion preventing film when the first wire material is embedded in the second wiring groove; and a sub-step of forming a fourth wire material diffusion preventing film on an upper surface of the third interlayered insulating film and on an upper surface of the first wire material embedded in the second wiring groove. The step of forming the wire layer may comprise: a sub-step of forming a second wiring groove in a third interlayered insulating film by using the lithography method and the anisotropic etching method; a sub-step of forming a third wire material diffusion preventing film on an inner surface of the second wiring groove and on an upper surface of the third interlayered insulating film; a sub-step of forming the first wire material on an upper surface of the first wire material diffusion preventing film; a sub-step of removing back the cladded third wire material diffusion preventing film and the first wire material by first removing back means until the third interlayered insulating film is exposed, and simultaneously removing back a part of a third wire material diffusion preventing film portion in the second wiring groove and a part of the first wire material; a sub-step of forming a fourth wire material diffusion preventing film on an upper surface of the third wire material diffusion preventing film portion in the second wiring groove whose a part is removed and the first wire material whose a part is removed; and a sub-step of removing back the fourth wire material diffusion preventing film portion by second removing back means until the third interlayered insulating film is exposed, and remaining the fourth wire material diffusion preventing film in only the wiring groove. The first and second removing back means may be a chemical etching method using an activator. The second removing back means may be a polishing method. The etching stopper film may comprise a silicon nitride.

According to the present invention, there is yet further provided a method of manufacturing a semiconductor device comprising: a step of forming a wire layer having a first wire material whose side surface is covered with a wire material diffusion preventing film; a step of forming a first interlayered insulating film on the wire layer; a step of forming an etching stopper film on the interlaminar insulating layer; a step of forming a second interlayered insulating film on the etching stopper film; a step of coating a first resist on the second interlayered insulating film, patterning the first resist at the upper portion of the first wire material by a lithography method, using the patterned first resist as a mask, and etching-removing the second interlayered insulating film by using the anisotropic etching until the etching stopper film is exposed, thereby forming a first wiring groove in the second interlayered insulating film; a step of forming a first wire material diffusion preventing film on the upper surface of the second interlayered insulating film and on the inner surface of the first wiring groove after removing the first resist; a step of coating a second resist on the first wire material diffusion preventing film, patterning the second resist in the first wiring groove by the lithography method, using the patterned second resist as the mask, and removing the first wire material diffusion preventing film portion of the first wiring groove bottom portion, the etching stopper film and the wire material diffusion preventing film portion covering the upper surface of the first interlayered insulating film and the first wire material, exposing the first wire material, thereby forming an connecting hole; a step of forming a second wire material diffusion preventing film at least on a surface of the first wire material diffusion preventing film, on a side surface of the connecting hole and on an upper surface of the first wire material; a step of removing the second wire material diffusion preventing film portion on the upper surface of the first wire material by using the anisotropic method, while remaining a second wire material diffusion preventing film portion on the side surface of the connecting hole and on a side surface of the first wiring groove; and a step of embedding a second wire material in the connecting hole and the first wiring groove. The step of forming the wire layer may comprise: a sub-step of forming a second wiring groove in a third interlayered insulating film by using the lithography method and the anisotropic etching method; a sub-step of forming a first wire material whose only surface contacted to the second wiring groove of the first wire material is covered with a third wire material diffusion preventing film when the first wire material is embedded in the second wiring groove; and a sub-step of forming a fourth wire material diffusion preventing film on an upper surface of the third interlayered insulating film and on an upper surface of the first wire material embedded in the second wiring groove. The step of forming the wire layer may comprise: a sub-step of forming a second wiring groove in a third interlayered insulating film by using the lithography method and the anisotropic etching method; a sub-step of forming a third wire material diffusion preventing film on an inner surface of the second wiring groove and on an upper surface of the third interlayered insulating film; a sub-step of forming the first wire material on an upper surface of the first wire material diffusion preventing film; a sub-step of removing back the cladded third wire material diffusion preventing film and the first wire material by first removing back means until the third interlayered insulating film is exposed, and simultaneously removing back a part of a third wire material diffusion preventing film portion in the second wiring groove and a part of the first wire material; a sub-step of forming a fourth wire material diffusion preventing film on an upper surface of the third wire material diffusion preventing film portion in the second wiring groove whose a part is removed and the first wire material whose a part is removed; and a sub-step of removing back the fourth wire material diffusion preventing film portion by second removing back means until the third interlayered insulating film is exposed, and remaining the fourth wire material diffusion preventing film in only the wiring groove. The first and second removing back means may be a chemical etching method using an activator. The second removing back means may be a polishing method. The etching stopper film may comprise a silicon nitride.

According to the present invention, there is further provided a method of manufacturing a semiconductor device comprising: a step of forming a wire layer having a first wire material whose periphery is covered with a first wire material diffusion preventing film via an insulating layer on a substrate; a step of forming a first interlayered insulating film, a second wire material diffusion preventing film having an opened region where a connecting hole is to be formed and a second interlayered insulating film having the insulation characteristic on the wire layer; a step of forming a first wiring groove in the second interlayered insulating film; a step of removing the first wire material diffusion preventing film portion covering the first interlayered insulating film and an upper surface of the first wire material via an opened region in the second wire material diffusion preventing film at a bottom portion of the first wiring groove, and exposing the first wire, thereby forming an connecting hole; a step of forming a third wire material diffusion preventing film on a surface of the second wire material diffusion preventing film, an inner side surface of the connecting hole, an upper surface of the first wire material and a surface of the second interlayered insulating film; a step of removing the third wire material diffusion preventing film on the upper surface of the first wire material, while remaining the third wire material diffusion preventing film on the side surface of the connecting hole and on a side surface of the first wiring groove; and a step of embedding a second wire material in the connecting hole and the first wiring groove. The step of forming the wire layer may comprise: a sub-step of forming a second wiring groove in a third interlayered insulating film by using the lithography method and the anisotropic etching method; and a sub-step of covering a side surface of the first wire material with a third wire material diffusion preventing film when a first wire material is embedded in the second wiring groove. The step of forming the wire layer may comprise: a sub-step of forming a second wiring groove in a third interlayered insulating film by using the lithography method and the anisotropic etching method; a sub-step of forming a second wire material diffusion preventing film on an inner surface of the second wiring groove and an upper surface of the third interlayered insulating film; a sub-step of forming the first wire material on the upper surface of the first wire material diffusion preventing film, removing back the second wire material diffusion preventing film and the first wire material until the third interlayered insulating film is exposed by the first removing back means, and simultaneously removing a first wire material diffusion preventing film in the second wiring groove and a part of the first wire material; and a sub-step of forming a third wire material diffusion preventing film on an upper surface of a second wire material diffusion preventing film in the second wiring groove whose at least a part is removed and the first wire material, and removing back the third wire material diffusion preventing film until the third interlayered insulating film is exposed by using the second removing back means, while remaining the third wire material diffusion preventing film in only the wiring groove. The etching stopper film may comprise a silicon nitride.

According to the present invention, there is still further provided a method of manufacturing a semiconductor device wherein a wire layer having a wire whose side surface is covered with a wire material diffusion preventing film is formed via an interlayered insulating film, a method of manufacturing a contact hole for connecting the wires comprising: a step of forming a wire layer having a first wire material whose side surface is covered with a wire material diffusion preventing film; a step of forming a first interlayered insulating film on the wire layer; a step of forming an etching stopper having a copper diffusion preventing function on the interlayered insulating film; a step of coating a first resist on the etching stopper film, patterning the first resist at an upper portion of the first wire material by using the lithography method, using the patterned first resist as the mask, and removing back the etching stopper film by using the anisotropic etching method, thereby forming a pattern for forming an connecting hole; a step of forming a second interlayered insulating film in the pattern for forming the connecting hole and a main surface of the etching stopper film after removing the first resist; a step of coating a second resist on the second interlayered insulating film, patterning the second resist at least at an upper portion of the pattern for forming the connecting hole by using the lithography method, using the patterned second resist as the mask, and removing back the second interlayered insulating film, thereby forming a first wiring groove, using the etching stopper film patterned for forming the connecting hole and the patterned second resist as the mask, removing back a wire material diffusion preventing film covering the interlayered insulating film and an upper surface of the first wire material, to expose the first wire material, thereby forming an connecting hole; a step of forming a first wire material diffusion preventing film on an inner surface of the first wiring groove, on an upper surface of the second interlayered insulating film, on a side surface of the connecting hole and on an upper surface of the exposed first wire material after removing the patterned second resist; a step of removing the first wire material diffusion preventing film on the upper surface of the second interlayered insulating film and on the upper surface of the first wire material by using the anisotropic etching method; and a step of embedding a second wire material in the connecting hole and the first wiring groove. The step of forming the wire layer may comprise: a sub-step of forming a second wiring groove in a third interlayered insulating film by using the lithography method and the anisotropic etching method; and a sub-step of covering a side surface of the first wire material with a third wire material diffusion preventing film when a first wire material is embedded in the second wiring groove. The step of forming the wire layer may comprise: a sub-step of forming a second wiring groove in a third interlayered insulating film by using the lithography method and the anisotropic etching method; a sub-step of forming a second wire material diffusion preventing film on an inner surface of the second wiring groove and an upper surface of the third interlayered insulating film; a sub-step of forming the first wire material on the upper surface of the first wire material diffusion preventing film, removing back the second wire material diffusion preventing film and the first wire material until the third interlayered insulating film is exposed by the first removing back means, and simultaneously removing a first wire material diffusion preventing film in the second wiring groove and a part of the first wire material; and a sub-step of forming a third wire material diffusion preventing film on an upper surface of a second wire material diffusion preventing film in the second wiring groove whose at least a part is removed and the first wire material, and removing back the third wire material diffusion preventing film until the third interlayered insulating film is exposed by using the second removing back means, while remaining the third wire material diffusion preventing film in only the wiring groove. The first and second removing back means may be a chemical etching method using an activator. The second back removing means may be a polishing method. The etching stopper film may comprise a silicon nitride.

According to the present invention, there is yet further provided a method of manufacturing a semiconductor device for electrically connecting a first metal wire and a second metal wire formed in different layers of a multi-layer wire structure on a substrate to each other comprising: a step of forming the first metal wire whose periphery is covered with a first film; a step of forming an interlayered insulating film having a wiring groove on the first metal wire; a step of forming a second film on a surface of the interlayered insulating film; a step of forming a connecting hole extended from a bottom portion of the wiring groove to the first metal wire; a step of forming a third film at the bottom portion and a side surface of the wiring groove and at a bottom portion and a side surface of the connecting hole; a step of removing the third film portion on the connecting hole bottom portion to expose the first metal wire by using an anisotropic etching, while remaining the third copper diffusion preventing film portion on the side surfaces of the wiring groove and the connecting hole; and a step of forming the second metal wire which is electrically connected to the first metal wire by embedding a metal material in the wiring groove and the connecting hole, whereby the first metal wire and the second metal wire are directly connected to each other not via the third film portion on the contact hole bottom portion, while the metal material in the connecting hole is covered with the film portion on the side surface of the contact hole. The first and second metal wires may be copper wires, and the first, second and third films may be copper diffusion preventing films. The copper diffusion preventing films may be a selected one from a group of amorphous titanium SiN, amorphous tungsten SiN, titanium nitride, tungsten, tantalum, niobium, and tantalum aluminium. The first and second metal wires may be aluminium wires, and the first, second and third films may be reflow increasing films of aluminium. The reflow increasing film may be a selected one from a group of amorphous titanium SiN, amorphous tungsten SiN, titanium nitride, tungsten, tantalum, niobium, and tantalum aluminium.

According to the present invention, there is further provided a method of manufacturing a semiconductor device for electrically connecting a first metal wire and a second metal wire formed in different layers of a multi-layer wire structure formed via respective insulating films on a substrate to each other comprising: a step of forming the first metal wire whose periphery is covered with a first film; a step of sequentially forming a first interlayered insulating film on the first metal wire and a second film having an opening and a second interlayered insulating film having a wiring groove within a region where a connecting hole is to be formed; a step of forming the connecting hole extended from a bottom portion of the wiring groove to the first metal wire via the opening of the second film; a step of forming a third film at the bottom portion and on a side surface of the wiring groove and at a bottom portion and on a side surface of the connecting hole; a step of removing the third film portion on the connecting hole bottom portion to expose the first metal wire by using the anisotropic etching, while remaining the third film portion on the side surfaces of the wiring groove and the connecting hole; and a step of forming the second metal wire which is electrically connected to the first metal wire by embedding the metal material in the wiring groove and the connecting hole, whereby the first metal wire and the second metal wire are directly connected to each other not via the third film portion on the contact hole bottom portion, while the metal material in the connecting hole is covered with the third film on the side surface of the contact hole. The first and second metal wires may be copper wires, and the first, second and third films may be copper diffusion preventing films. The copper diffusion preventing films may be a selected one from a group of amorphous titanium SiN, amorphous tungsten SiN, titanium nitride, tungsten, tantalum, niobium, and tantalum aluminium. The first and second metal wires are aluminium wires, and the first, second and third films may be reflow increasing films of aluminium. The reflow increasing film may be a selected one from a group of amorphous titanium SiN, amorphous tungsten SiN, titanium nitride, tungsten, tantalum, niobium, and tantalum aluminium.

According to the present invention, there is still further provided a method of manufacturing a semiconductor device comprising: a step of forming a first metal wire whose periphery is covered with a first film via an insulating layer on a semiconductor substrate; a step of forming a first interlayered insulating film, a second film and a second interlayered insulating film having an insulation characteristic on the first metal wire; a step of forming a first wiring groove in the second interlayered insulating film, by selectively etching the second interlayered insulating film until the second film is exposed; a step of removing a portion of the second film at a bottom portion of the first wiring groove, the second film and the first film portion covering an upper surface of the first interlayered insulating film and the first metal wire, to expose the first metal wire, thereby forming an connecting hole; a step of forming a third film on a surface of the second film, on an inner side surface of the connecting hole and on an upper surface of the first metal wire; a step of removing the third film portion on the upper surface of the first metal wire, while remaining the third film portion on the side surface of the connecting hole and on the side surface of the first wiring groove; and a step of embedding a second metal wire in the connecting hole and the first wiring groove. The first and second metal wires may be copper wires, and the first, second and third films may be copper diffusion preventing films. The copper diffusion preventing films may be a selected one from a group of amorphous titanium SiN, amorphous tungsten SiN, titanium nitride, tungsten, tantalum, niobium, and tantalum aluminium. The first and second metal wires may be aluminium wires, and the first, second and third films may be reflow increasing films of aluminium. The reflow increasing film may be a selected one from a group of amorphous titanium SiN, amorphous tungsten SiN, titanium nitride, tungsten, tantalum, niobium, and tantalum aluminium.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 shows a cross sectional view of a process of manufacturing the semiconductor device according to the first embodiment of the present invention;

FIG. 5 shows a cross sectional view of a process of manufacturing the semiconductor device according to the first embodiment of the present invention;.

FIG. 6 shows a cross sectional view of a process of manufacturing a semiconductor device according to a second embodiment of the present invention;

FIG. 14 shows a cross sectional view of a process of manufacturing the semiconductor device according to the third embodiment of the present invention;

FIG. 15 shows a cross sectional view of a process of manufacturing the semiconductor device according to the third embodiment of the present invention;

FIG. 16 shows a cross sectional view of a process of manufacturing the semiconductor device according to the third embodiment of the present invention;

FIG. 17 shows a cross sectional view of a process of manufacturing a semiconductor device according to a fourth embodiment of the present invention;

FIG. 18 shows a cross sectional view of a process of manufacturing the semiconductor device according to the fourth embodiment of the present invention;

FIG. 19 shows a cross sectional view of a process of manufacturing a semiconductor device according to a fifth embodiment of the present invention;

FIG. 22 shows a cross sectional view of a process of manufacturing a semiconductor device according to an eight embodiment of the present invention;

FIG. 23 shows a cross sectional view of a process of manufacturing a semiconductor device according to a ninth embodiment of the present invention;

DETAILED DESCRIPTION OF THE INVENTION

Figure 1:
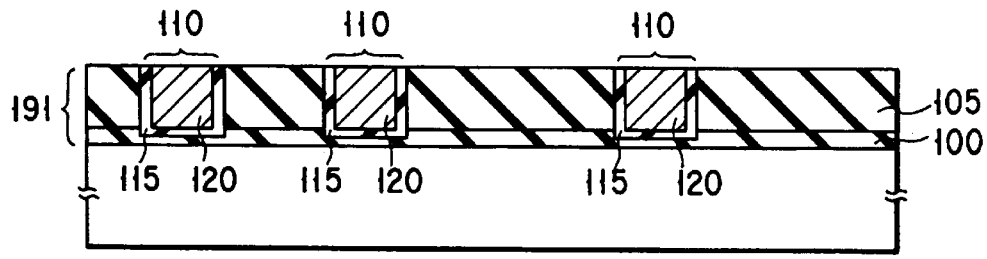
FIG. 1 shows a cross sectional view of a process of manufacturing a semiconductor device according to a first embodiment of the present invention.

A first embodiment of the present invention will be explained in detail by using FIGS. 1 to 5 of the accompanying drawings. As shown in FIG. 1, an etching stopper film 100 comprising a silicon nitride whose thickness is about 100 nm is formed on a semiconductor substrate by using a CVD method. Next, an interlayered insulating film 105 whose thickness is about 0.2 to 1.0 µm comprising a silicon dioxide is formed on the etching stopper film 100 by the using the CVD method. Next, a wiring groove 110 is formed in the interlayered insulating film 105 by using a usual lithography method and an anisotropic etching method. Next, a copper diffusion preventing film 115 whose thickness is about 50 nm comprising the silicon nitride is formed on an inner surface of the wiring groove 110 and a main surface of the interlayered insulating film 105 by using a sputter method or the CVD method. Next, a metal wire material 120 having the main component of a copper or comprising a pure copper is formed on the copper diffusion preventing film 115 by using the sputter method or the CVD method. Next, the copper diffusion preventing film 115 and the metal wire material 120 are removed back by using a usual removing back method until the interlayered insulating film 105 is exposed. Thereby, the copper diffusion preventing film and the metal wire are formed in the wiring groove 110. In such a manner, a lower-layered wire structure 191 is formed on the semiconductor substrate.

As described above, in general, a silicon nitride film is used as the etching stopper film 100. Silicon nitride film has a sufficiently large etching ratio relative to the interlayered insulating film comprising the silicon dioxide, and has an excellent insulating property.

Furthermore, an etch back method having an excellent anisotropy and an excellent work controllability or a chemical etching method using an activator is used as removing back means. Furthermore, in order that an excess heat is not applied to the semiconductor device, polishing by a CMP apparatus may be used as the removing back means.

Furthermore, most effectively, although a silicon nitride film which can be easily formed is used as the copper diffusion preventing film 115 formed in the wiring groove 110, this is not limited. Such a material as amorphous titanium SiN, amorphous tungsten SiN, titanium nitride, tungsten, tantalum, niobium, tantalum aluminium or the like having a slow diffusion rate of the copper may be used. As described later, since a portion of the copper diffusion preventing film 115, which is at the contact portion of the wire layer in the upper-layered wiring structure and the wire layer in the lower-layered wiring structure, is removed at a later step, the copper diffusion preventing film 115 may be made of conductive material or insulative material.

Figure 2:
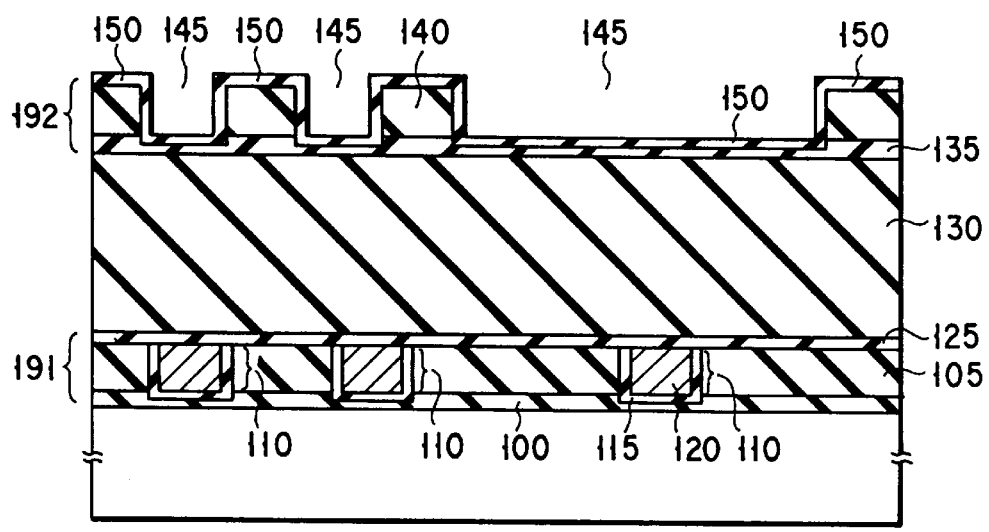
FIG. 2 shows a cross sectional view of a process of manufacturing the semiconductor device according to the first embodiment of the present invention.

Next, as shown in FIG. 2, a copper diffusion preventing film 125 whose thickness is about 50 nm comprising the silicon nitride is formed on the interlayered insulating film 105 by using the sputter method or the CVD method. Next, an interlayered insulating film 130 whose thickness is about 0.5 µm comprising the silicon dioxide is formed on the copper diffusion preventing film 125 by using the CVD method. Next, an etching stopper film 135 whose thickness is about 100 nm comprising the silicon nitride is formed on the interlayered insulating film 130 by using the CVD method. Next, an interlayered insulating film 140 is formed on the etching stopper film 135 by using the CVD method. Next, a wiring groove 145 is formed in the interlayered insulating film 140 by using the usual lithography method and the anisotropic etching method. Next, a copper diffusion preventing film 150 whose thickness is about 50 nm comprising the silicon nitride is formed on the inner surface of the wiring groove 145 and the main surface of the interlayered insulating film 140 by using the CVD method. In such a manner, an upper layer wire structure 192 is formed on the interlayered insulating film 130.

Figure 3:
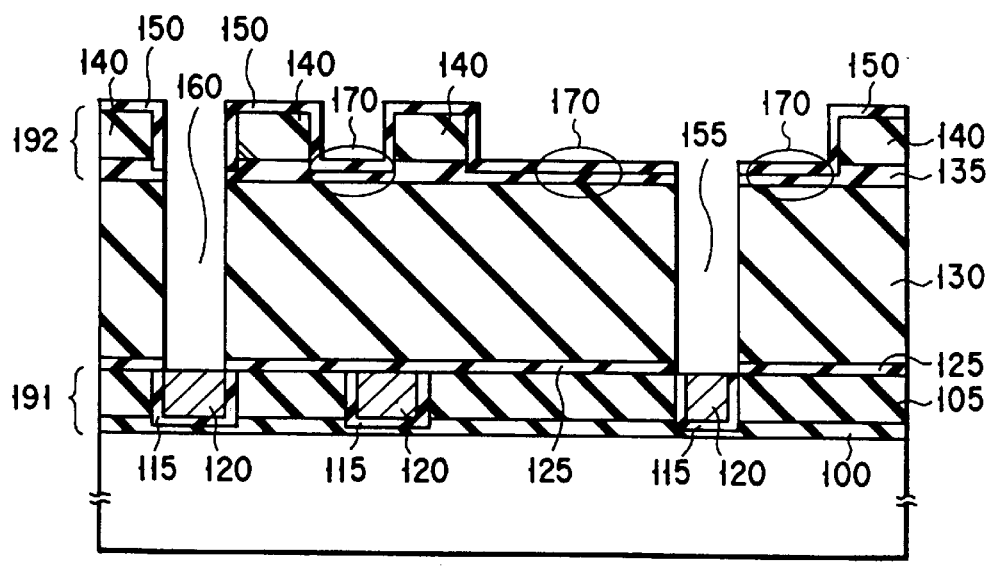
FIG. 3 shows a cross sectional view of a process of manufacturing the semiconductor device according to the first embodiment of the present invention.

Next, as shown in FIG. 3, a resist (not shown) is coated on the copper diffusion preventing film 150, and the resist is patterned by using the usual lithography method. Next, the patterned resist (not shown) is used as a mask, thereby the copper diffusion preventing film 150, the etching stopper film 135, the interlayered insulating film 130 and the copper diffusion preventing film 125 are sequentially removed by using the anisotropic etching method. The metal wire material 120 is exposed, thereby connecting holes 155 and 160 for connecting the upper layer wire structure 192 and the lower layer wire structure 191 are formed.

Next, as shown in FIG. 4, a copper diffusion preventing film 165 whose thickness is about 50 nm comprising the silicon nitride is formed by the CVD method. By such a manner, the film thickness of the copper diffusion preventing film portion of a wiring groove bottom portion 170 can be (about twice) thicker than that of the copper diffusion preventing film portion of an connecting hole bottom portion 175. Furthermore, the copper diffusion preventing film can be formed on the side surface of the connecting holes 155 and 160.

Next, as shown in FIG. 5, the copper diffusion preventing film of an connecting hole bottom portion 175 is removed by the anisotropic etching method without using the mask. In this case, a part of the copper diffusion preventing film of a wiring groove bottom portion 170 is also removed. However, as described above, the film thickness of the copper diffusion preventing film portion of the wiring groove bottom portion 170 is thicker than that of the copper diffusion preventing film portion of the connecting hole bottom portion 175. Accordingly, as shown in FIG. 5, the copper diffusion preventing film portion of the connecting hole bottom portion 175 is removed, while, the copper diffusion preventing film portion of the wiring groove bottom portion 170 can be remained. Thereafter, the metal wire material having the main component of the copper or containing the pure copper is embedded in the connecting holes 155, 160 and the wiring groove 145. Thereby, the semiconductor device having the multi-layer wire structure is manufactured.

According to the method of manufacturing of the first embodiment, as described above, the copper diffusion preventing film portion except for the connecting hole bottom portion can be remained, and the copper diffusion preventing film portion of the connecting hole bottom portion can be removed. Accordingly, it is possible to prevent the electromigration and the resistance increase of the wire in the connecting hole occurred due to the existence of the copper diffusion preventing film portion of the connecting hole bottom portion.

Next, a second embodiment will be explained in detail by using FIGS. 6 to 11 of the accompanying drawings. As shown in FIG. 6, an etching stopper film 500 whose thickness is about 100 nm comprising the silicon nitride is formed on the semiconductor substrate by using the CVD method. Next, an interlayered insulating film 505 whose thickness is about 0.2 to 1.0 μm comprising the silicon dioxide is formed on the etching stopper film 500 by the using the CVD method. Next, a wiring groove 510 is formed in the interlayered insulating film 505 by using the usual lithography method and the anisotropic etching method. Next, a copper diffusion preventing film 515 whose thickness is about 50 nm comprising the silicon nitride is formed on the inner surface of the wiring groove 510 and the main surface of the interlayered insulating film 505 by using the sputter method or the CVD method. Next, a metal wire material 520 having the main component of the copper or containing the pure copper is formed on the copper diffusion preventing film 515 by using the sputter method or the CVD method.

Figure 7:
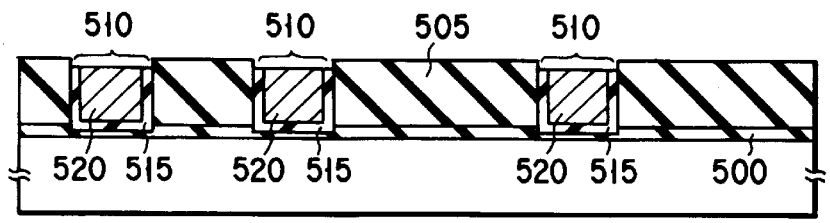
FIG. 7 shows a cross sectional view of a process of manufacturing the semiconductor device according to the second embodiment of the present invention.

Next, as shown in FIG. 7, the copper diffusion preventing film 515 and the metal wire material 520 is removed back by using the removing back method. Thereby, the main surface of interlayered insulating film 505 is exposed, and the copper diffusion preventing film 515 and the metal wire material 520 in the wiring groove 510 are also removed back by a predetermined thickness.

Here, the chemical etching method, for example, a reactive ion etching method (as referred as a RIE method below) using the activator is used as removing back means. The RIE method has the excellent anisotropy and an excellent fine workability.

Figure 8:
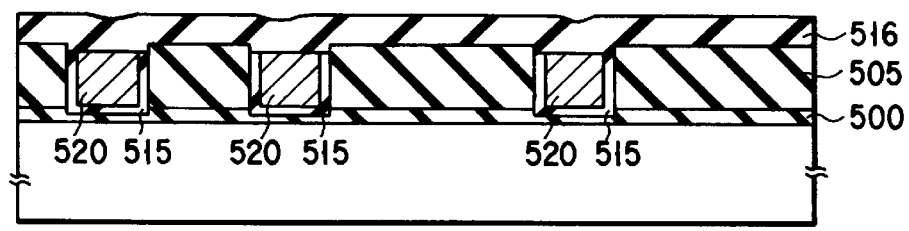
FIG. 8 shows a cross sectional view of a process of manufacturing the semiconductor device according to the second embodiment of the present invention.

Next, as shown in FIG. 8, a copper diffusion preventing film 516 comprising the silicon nitride is formed on the exposed interlayered insulating film 505 and metal wire material 520 by using the CVD method or using sputtering method.

Figure 9:
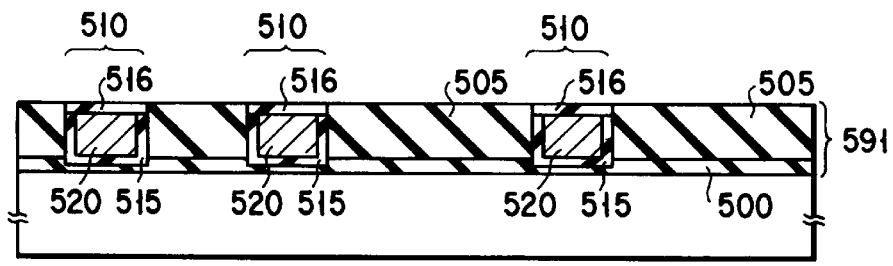
FIG. 9 shows a cross sectional view of a process of manufacturing the semiconductor device according to the second embodiment of the present invention.

Next, as shown in FIG. 9, the copper diffusion preventing film 516 is removed back by using the RIE method or the CMP (chemical mechanical polishing) apparatus until the interlayered insulating film 505 is exposed. Thereby, the copper diffusion preventing film 515, 516 and the metal wire material 520 are formed in the wiring groove 510. In such a manner, a lower-layered wire structure 591 is formed on the semiconductor substrate.

Furthermore, most effectively, although the silicon nitride film which can be easily formed is used as the copper diffusion preventing films 515 and 516, this is not limited. Such a material as the amorphous titanium SiN, the amorphous tungsten SiN, the titanium nitride, the tungsten, the tantalum, niobium, tantalum aluminium or the like having the extremely slow diffusion rate of the copper may be used.

Figure 10:
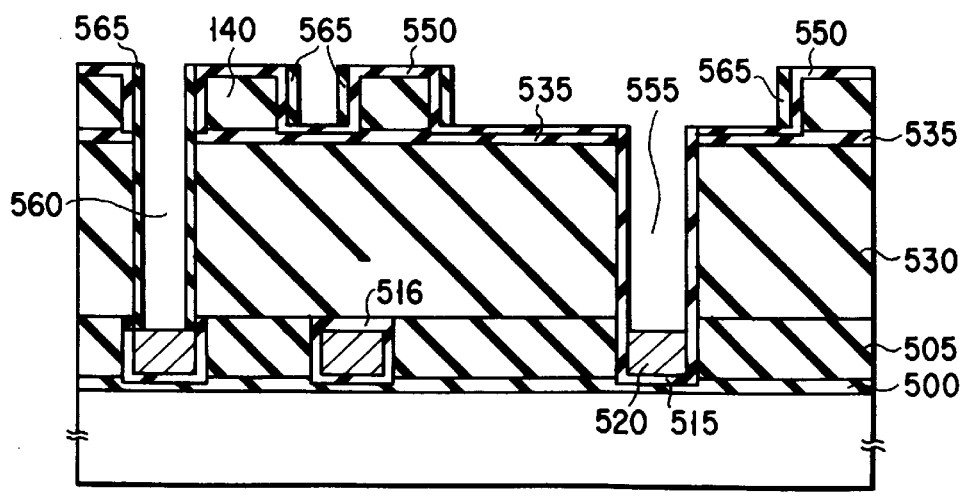
FIG. 10 shows a cross sectional view of a process of manufacturing the semiconductor device according to the second embodiment of the present invention.

Next, as shown in FIG. 10, the same process as the process shown in FIGS. 2 to 5 according to the first embodiment is carried out, thereby the semiconductor device having the multi-layer wire structure is manufactured.

According to the method of manufacturing of the second embodiment, similarly to the first embodiment, the copper diffusion preventing film portion except for the connecting hole bottom portion can be remained, and the copper diffusion preventing film portion of the connecting hole bottom portion can be removed. Accordingly, it is possible to prevent the disconnection of the wire caused due to the electromigration and the resistance increase of the wire in the connecting hole caused by the existence of the copper diffusion preventing film portion of the connecting hole bottom portion.

Figure 11:
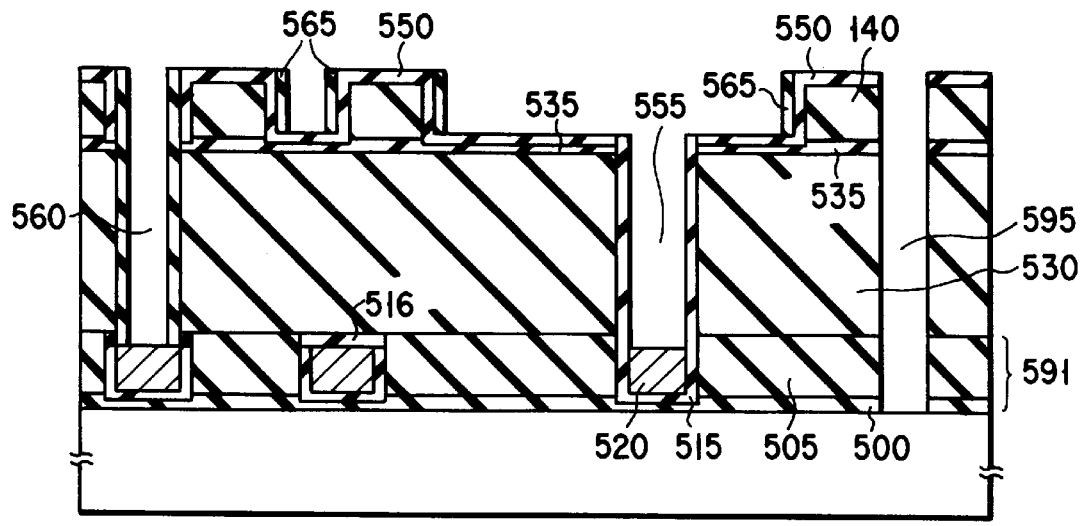
FIG. 11 shows a cross sectional view of a process of manufacturing the semiconductor device according to the second embodiment of the present invention.

Furthermore, according to the second embodiment, differently from the first embodiment, since the copper diffusion preventing film does not exist between the interlayered insulating films 505 and 530, as shown in FIG. 11, it is possible to easily form a through hole 595 connected to a further lower-layered structure (according to the second embodiment, the semiconductor substrate) than the lower-layered wire structure 591.

Figure 12:
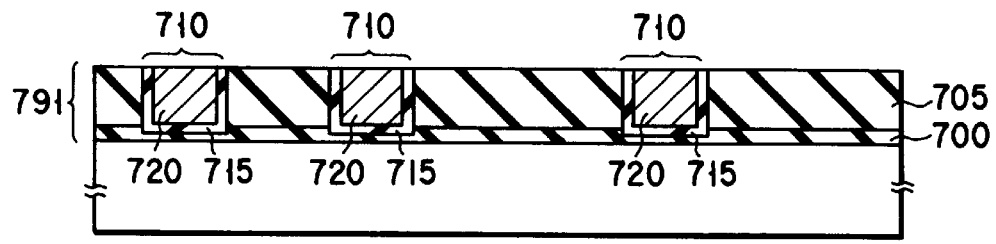
FIG. 12 shows a cross sectional view of a process of manufacturing the semiconductor device according to a third embodiment of the present invention.

Next, a third embodiment will be explained in detail by using FIGS. 12 to 16 of the accompanying drawings. As shown in FIG. 12, the same method as the method shown in FIG. 1 according to the first embodiment is used, thereby a lower-layered wire structure 791 is formed.

Figure 13:
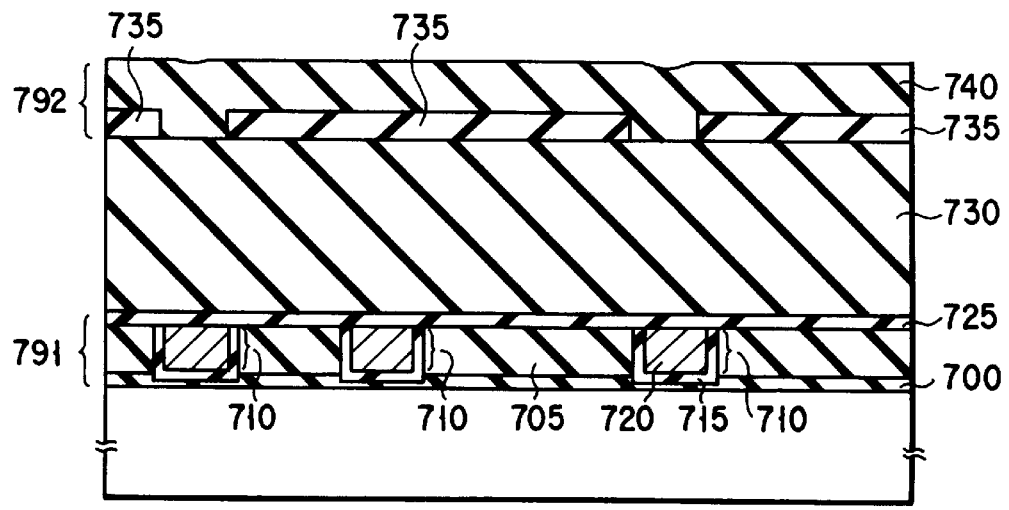
FIG. 13 shows a cross sectional view of a process of manufacturing the semiconductor device according to the third embodiment of the present invention.
Figure 20:
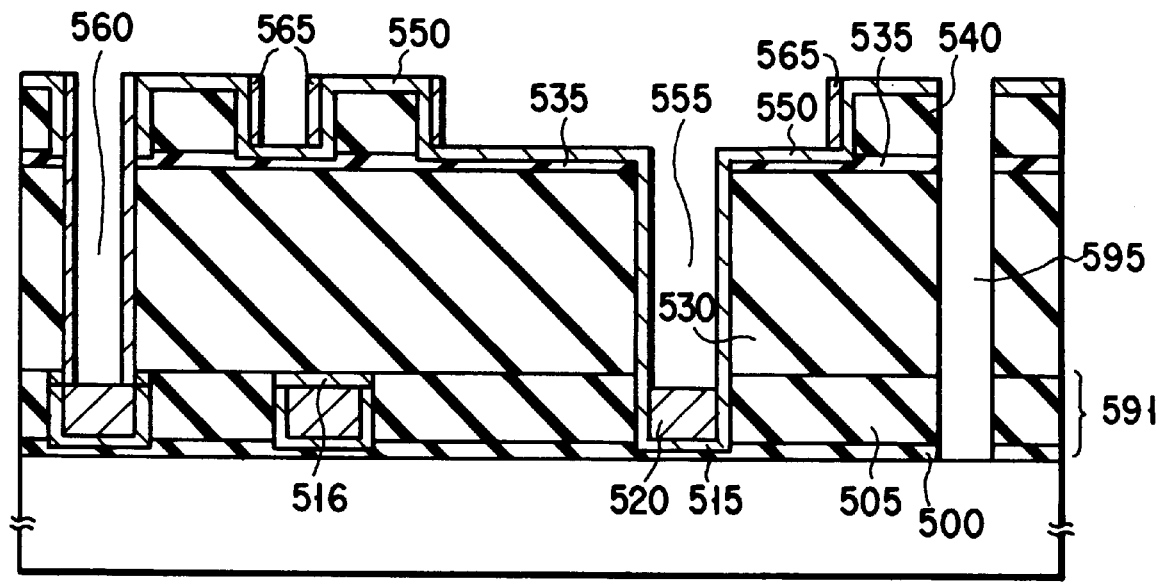
FIG. 20 shows a cross sectional view of a process of manufacturing a semiconductor device according to a sixth embodiment of the present invention.
Figure 21:
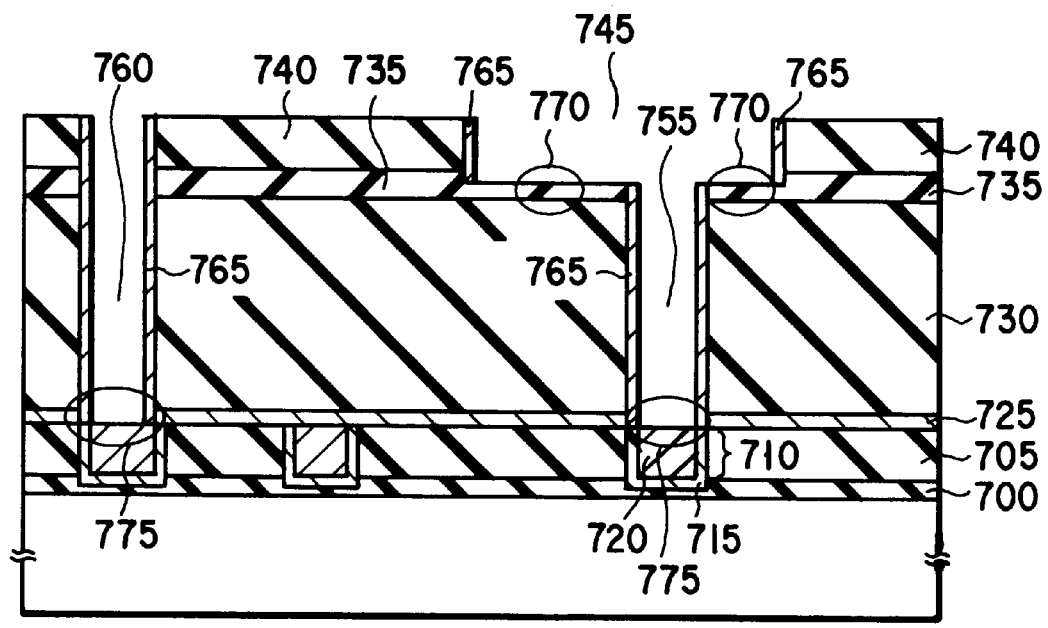
FIG. 21 shows a cross sectional view of a process of manufacturing a semiconductor device according to a seventh embodiment of the present invention.
Figure 24:
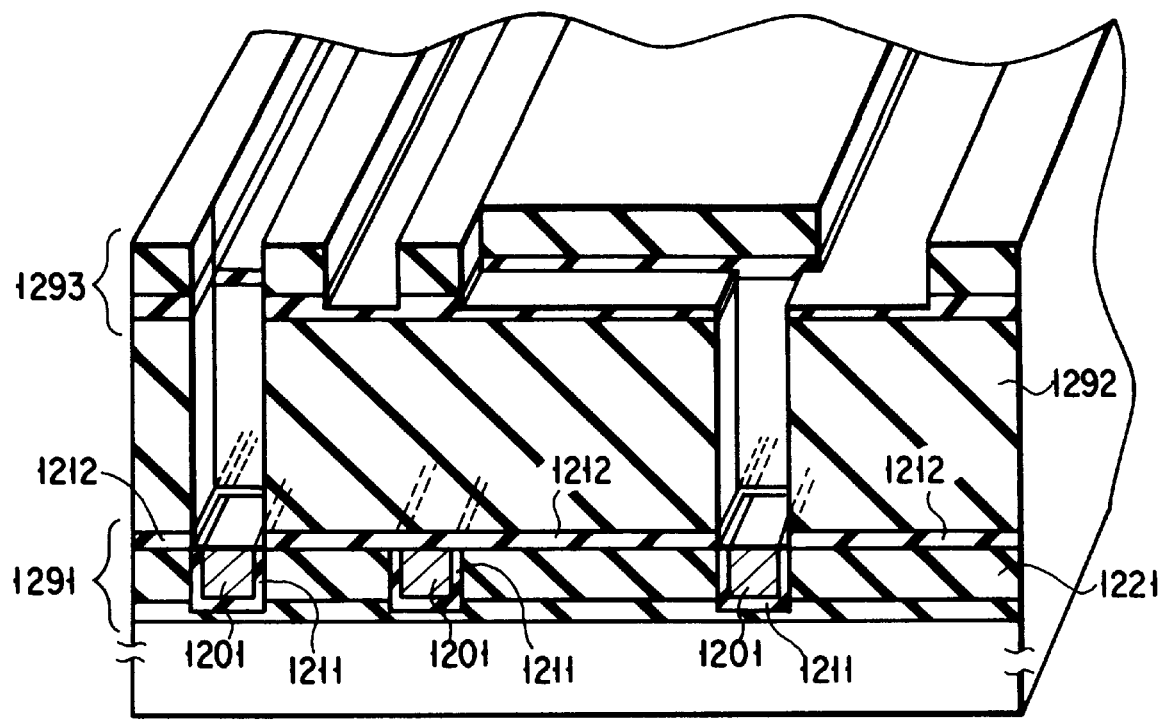
FIG. 24 shows a cross sectional and perspective view of a process of manufacturing a semiconductor device according to a conventional method.
Figure 25:
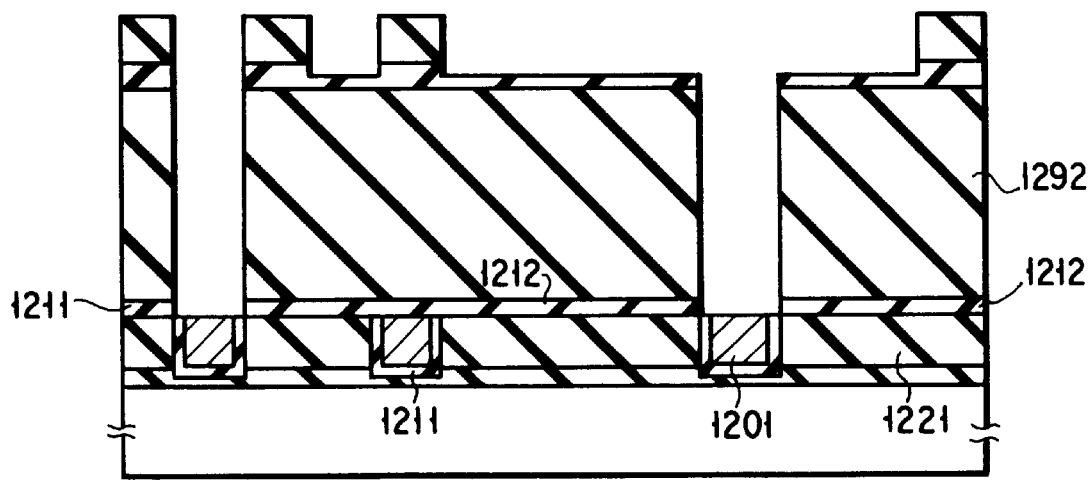
FIG. 25 shows a cross sectional view of a process of manufacturing a semiconductor device according to the conventional method.
Figure 26:
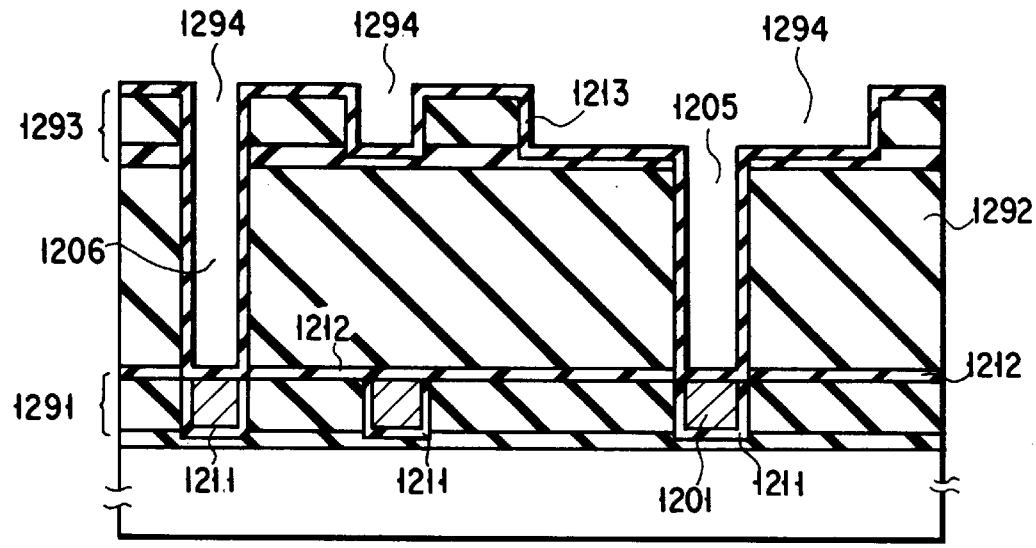
FIG. 26 shows a cross sectional view of a process of manufacturing a semiconductor device according to the conventional method.
Figure 27:
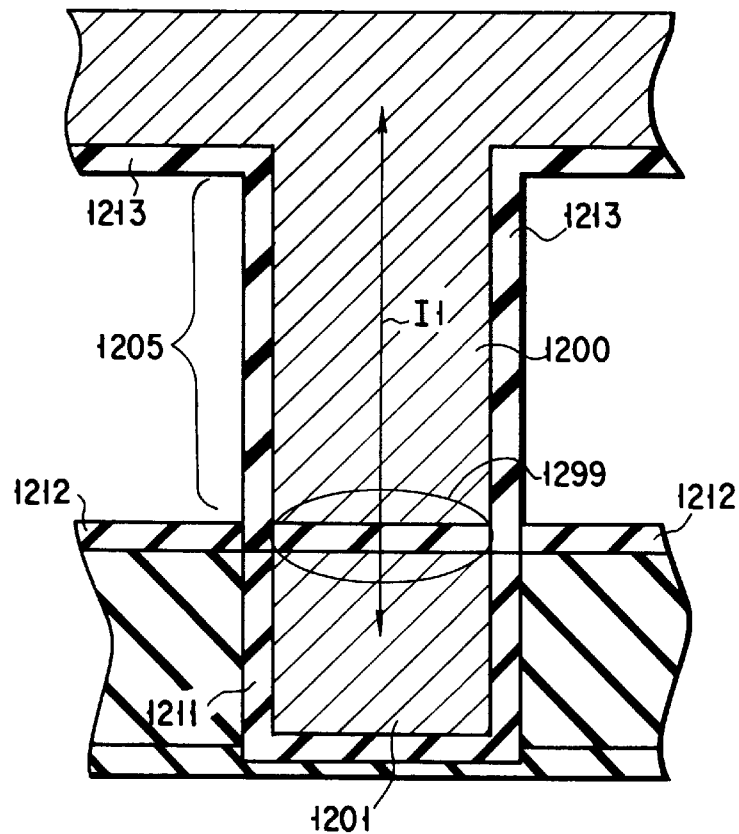
FIG. 27 shows a cross sectional view of a process of manufacturing a semiconductor device according to the conventional method.

Next, as shown in FIG. 13, a copper diffusion preventing film 725 whose thickness is 50 nm comprising the silicon nitride is formed on an interlayered insulating film 705 by using the sputter method or the CVD method. Next, an interlayered insulating film 730 whose thickness is about 0.5 μm comprising the silicon dioxide is formed on the copper diffusion preventing film 725 by the CVD method. Next, an etching stopper film 735 whose thickness is about 200 nm comprising the silicon nitride is formed on the interlayered insulating film 730 by the CVD method. Next, the etching stopper film 735 is patterned for forming the connecting hole by using the usual lithography method and anisotropic etching method. Furthermore, an interlayered insulating film 740 is formed on the patterned etching stopper film 735 by the CVD method. Thereby, an upper layered wire structure 792 is formed on the interlayered insulating film 730. Furthermore, the thickness of the etching stopper film 735 is about 200 nm, and the thickness of the etching stopper film 735 is formed in such a manner that it is (about twice) thicker than that according to the first and second embodiments.

Next, as shown in FIG. 14, the resist (not shown) is coated on the interlayered insulating film 740, and the resist is patterned by using the usual lithography method. Next, using the patterned resist (not shown) as a mask, the interlayered insulating film 740 is removed by using the anisotropic etching method, thereby a wiring groove 745 is formed. Furthermore, in this etching process, sequentially, using the etching stopper film 735 as the mask, the interlayered insulating film 730 is etching-removed. Thereby, connecting holes 760 and 755 are formed, and a wire material 720 is exposed.

Furthermore, in this process, the wiring groove 745 is formed and the connecting holes 755 and 760 are sequentially formed. Accordingly, when the wiring groove 745 is formed, the etching stopper film 735 serves as the etching stopper film. On the other hand, when the connecting holes 755 and 760 are formed, the etching stopper film 735 serves as the mask. Thus, when the connecting holes 755 and 760 are formed, the film thickness of the etching stopper film 735 must be thickly formed so that the interlayered insulating film 730 may not be exposed by the etching-removal of the interlayered insulating film 730. The film thickness thereof is determined by an etching condition (such as a kind of etchant gas, an etching time, etc.), an etching ratio of the etching stopper film 735 and the connecting hole and the like.

Next, as shown in FIG. 15, a copper diffusion preventing film 765 whose thickness is 50 nm comprising the silicon nitride is formed by using the sputter method or the CVD method.

Next, as shown in FIG. 16, the copper diffusion preventing film 765 portion of an connecting hole bottom portion 775 is etching-removed by using the anisotropic etching method without using the mask. In this case, the upper surface of the interlayered insulating film 740 and the copper diffusion preventing film 765 portion of an wiring groove bottom portion 770 are also simultaneously removed. In the wiring groove bottom portion 770, since the etching stopper film 735 exists, the interlayered insulating film 730 is not exposed. Furthermore, thereafter, the metal wire material having the main component of the copper or containing the pure copper is embedded in the connecting holes 760, 755 and the wiring groove 745. Thereby, the semiconductor device having the multi-layer wire structure is manufactured.

Furthermore, since the etching stopper film 735 comprises the material (in this case, the silicon nitride) having a copper diffusion preventing function, the copper atom contained in the wire material is not diffused to the interlayered insulating film 730 via the wiring groove bottom portion 770.

According to the method of manufacturing of the third embodiment, as described above, the copper diffusion preventing film portion of the connecting hole bottom portion can be removed. Accordingly, it is possible to prevent the disconnection of the wire caused due to the electromigration and the resistance increase of the wire in the connecting hole caused by the existence of the copper diffusion preventing film portion of the connecting hole bottom portion.

Next a fourth embodiment will be explained in detail by using FIGS. 17 and 18 of the accompanying drawings. As shown in FIG. 17, the similar process to the process shown in FIGS. 6 to 9 is carried out, thereby a lower-layered structure 1191 is formed. In the lower-layered structure 1191, an interlayered insulating film 1105 and a wiring groove 1110 are formed. A periphery of the wiring groove 1110 is covered with copper diffusion preventing films 1116 and 1115, and a wire material 1120 is embedded therein.

Next, the similar process to the process shown in FIGS. 13 to 16 according to the third embodiment is carried out, thereby the semiconductor device having the multi-layer wire structure shown in FIG. 18 is manufactured.

Furthermore, most effectively, although the silicon nitride film which can be easily formed is used as the copper diffusion preventing film 1115, 1116, this is not limited. Such a material as the amorphous titanium SiN, the amorphous tungsten SiN, the titanium nitride, the tungsten, the tantalum, niobium, tantalum aluminium or the like having the extremely slow diffusion rate of the copper may be used.

As described above, according to the method of manufacturing of the fourth embodiment, similarly to the third embodiment, the copper diffusion preventing film portion of the connecting hole bottom portion can be removed. Accordingly, it is possible to prevent the electromigration and the resistance increase of the wire in the connecting hole caused by the existence of the copper diffusion preventing film portion of the connecting hole bottom portion.

In the above embodiments, a silicon nitride film, i.e., an insulating film, is used as the copper diffusion preventing film; however, the present invention is not limited thereto, except for 125 in FIG. 5 and 725 in FIG. 16. As described above, for example, amorphous titanium SiN, amorphous tungsten SiN, titanium nitride, tungsten, tantalum, niobium, tantalum, aluminium or the like may be used. FIGS. 19, 20, 21 and 22 correspond to FIGS. 5, 11, 16 and 18, respectively, and show cross sectional views of semiconductor devices in which conductive films such as tungsten films are used as the copper diffusion preventing films, except for 125 in FIG. 5 and 725 in FIG. 16.

Furthermore, according to the above embodiments, although the wiring grooves formed in the upper-layered structure are parallel to the wiring grooves formed in the lower layer structure, as shown in FIG. 23, an upper-layered wire 1117 and a lower-layered wire 1118 may be arranged in such a manner that these wires cross each other.

Furthermore, according to the above embodiments, the metal film is a copper film; however, the present invention is not restricted thereto. A material whose main component is aluminum or a material comprising a pure aluminum may be used as the metal film. In this case, the copper diffusion preventing film is replaced by a film for increasing the reflow of aluminium or the durable length of time of the aluminium wire. Material of such a film may be amorphous titanium SiN, amorphous tungsten SiN, titanium nitride, tungsten, tantalum, niobium, tantalum aluminium or the like.

Furthermore, when an arrangement of the wire is restricted to a design of the semiconductor device, preferably, the wires of the upper and lower layers are extended parallel to each other.

Furthermore, according to the present invention, the film portion of the connecting hole bottom portion can be removed. Accordingly, it is possible to prevent the electromigration and the resistance increase of the wire in the connecting hole caused by the existence of the film portion of the connecting hole bottom portion. Furthermore, the flexibility of the wire arrangement is increased.

Thus, according to the present invention, a high integrated semiconductor circuit, for example, DRAM, SRAM, DRAM Logic LSI which requires to reduce the wire resistance, to extend a durable length of time of the wire, to enhance the flexibility of the wire arrangement, or to prevent the wire material from diffusion therearound can be preferably used.

According to the present invention, as described above, only the film portion of the connecting hole bottom portion can be removed. Accordingly, a reduction of the durable length of time of the wire due to the electromigration and the resistance of the wire caused by the existence of the film portion of the connecting hole bottom portion can be suppressed. Furthermore, a deterioration of the characteristic of the semiconductor device due to the resistance increase of the wire in the connecting hole can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device for electrically connecting a first copper wire and a second copper wire formed in different layers of a multi-layer wire structure on a substrate to each other comprising:

a step of forming said first copper wire whose periphery is covered with a first copper diffusion preventing film;

a step of forming an interlayered insulating film having a wiring groove on said first copper wire;

a step of forming a second copper diffusion preventing film on a surface of said interlayered insulating film;

a step of forming a connecting hole extended from a bottom portion of said wiring groove to said first copper wire;

a step of forming a third copper diffusion preventing film at the bottom portion and a side surface of said wiring groove and at a bottom portion and a side surface of said connecting hole;

a step of removing said third copper diffusion preventing film portion on said connecting hole bottom portion to expose said first copper wire by using an anisotropic etching, while remaining said third copper diffusion preventing film portion on the side surfaces of said wiring groove and said connecting hole; and a step of forming said second copper wire which is electrically connected to said first copper wire by embedding a copper material in said wiring groove and said connecting hole, whereby said first copper wire and said second copper wire are directly connected to each other not via said third copper diffusion preventing film portion on said contact hole bottom portion, while said copper material in said connecting hole is covered with said third copper diffusion preventing film portion on the side surface of said wiring groove.

2. A method of manufacturing a semiconductor device, according to claim 1, wherein said copper diffusion preventing film are a selected one from a group of amorphous titanium SiN, amorphous tungsten SiN, titanium nitride, tungsten, tantalum, niobium, and tantalum aluminium.

3. A method of manufacturing a semiconductor device for electrically connecting a first copper wire and a second copper wire formed in different layers of a multi-layer wire structure formed via respective insulating films on a substrate to each other comprising:

a step of forming said first copper wire whose periphery is covered with a first copper diffusion preventing film;

a step of sequentially forming a first interlayered insulating film on said first copper wire and a second copper diffusion preventing film having an opening and a second interlayered insulating film having a wiring groove within a region where a connecting hole is to be formed;

a step of forming the connecting hole extended from a bottom portion of said wiring groove to said first copper wire via said opening of said second copper diffusion preventing film;

a step of forming a third copper diffusion preventing film at the bottom portion and on a side surface of said wiring groove and at a bottom portion and on a side surface of said connecting hole;

a step of removing said third copper diffusion preventing film portion on said connecting hole bottom portion to expose said first copper wire by using the anisotropic etching, while remaining said third copper diffusion preventing film portion on the side surfaces of said wiring groove and said connecting hole; and a step of forming said second copper wire which is electrically connected to said first copper wire by embedding copper material in said wiring groove and said connecting hole, whereby said first copper wire and said second copper wire are directly connected to each other not via said third copper diffusion preventing film portion on said contact hole bottom portion, while said copper material in said connecting hole is covered with said third copper diffusion preventing film on the side surface of said contact hole.

4. A method of manufacturing a semiconductor device, according to claim 3, wherein said copper diffusion preventing film are a selected one from a group of amorphous titanium SiN, amorphous tungsten SiN, titanium nitride, tungsten, tantalum, niobium, and tantalum aluminium.

5. A method of manufacturing a semiconductor device comprising:

a step of forming a first metal wire having a first wire material whose periphery is covered with a first wire material diffusion preventing film via an insulating layer on a substrate;

a step of forming a first interlayered insulating film, an etching stopper film and a second interlayered insulating film having an insulation characteristic on said first metal wire;

a step of forming a first wiring groove in said second interlayered insulating film, and forming a second wire material diffusion preventing film on an upper surface of said second interlayered insulating film and on an inner surface of said first wiring groove;

a step of removing said second wire material diffusion preventing film portion at a bottom portion of said first wiring groove, said etching stopper film and said first wire material diffusion preventing film portion covering an upper surface of said first interlayered insulating film and said first metal wire, to expose said first metal wire, thereby forming an connecting hole;

a step of forming a third wire material diffusion preventing film on a surface of said second wire material diffusion preventing film, on an inner side surface of said connecting hole and on an upper surface of said first metal wire;

a step of removing said third wire material diffusion preventing film portion on the upper surface of said first metal wire, while remaining said third wire material diffusion preventing film portion on the side surface of said connecting hole and on the side surface of said first wiring groove; and a step of embedding a second metal wire in said connecting hole and said first wiring groove.

6. A method of manufacturing a semiconductor device according to claim 5, wherein said step of forming said wire layer comprising:

a sub-step of forming a second wiring groove in a third interlayered insulating film by using the lithography method and the anisotropic etching method;

a sub-step of forming a first wire material whose only surface contacted to said second wiring groove of said first wire material is covered with a third wire material diffusion preventing film when said first wire material is embedded in said second wiring groove; and a sub-step of forming a fourth wire material diffusion preventing film on an upper surface of said third interlayered insulating film and on an upper surface of said first wire material embedded in said second wiring groove.

7. A method of manufacturing a semiconductor device according to claim 5, wherein said step of forming said wire layer comprising:

a sub-step of forming a second wiring groove in a third interlayered insulating film by using the lithography method and the anisotropic etching method;

a sub-step of forming a third wire material diffusion preventing film on an inner surface of said second wiring groove and on an upper surface of said third interlayered insulating film;

a sub-step of forming said first wire material on an upper surface of said first wire material diffusion preventing film;

a sub-step of removing back said cladded third wire material diffusion preventing film and said first wire material by first removing back means until said third interlayered insulating film is exposed, and simultaneously removing back a part of a third wire material diffusion preventing film portion in said second wiring groove and a part of said first wire material;

a sub-step of forming a fourth wire material diffusion preventing film on an upper surface of said third wire material diffusion preventing film portion in said second wiring groove whose a part is removed and said first wire material whose a part is removed; and a sub-step of removing back said fourth wire material diffusion preventing film portion by second removing back means until said third interlayered insulating film is exposed, and remaining said fourth wire material diffusion preventing film in only said wiring groove.

8. A method of manufacturing a semiconductor device according to claim 7, wherein said first and second removing back means is a chemical etching method using an activator.

9. A method of manufacturing a semiconductor device according to claim 7, wherein said second removing back means is a polishing method.

10. A method of manufacturing a semiconductor device according to claim 5, wherein said etching stopper film comprises a silicon nitride.

11. A method of manufacturing a semiconductor device comprising:

a step of forming a wire layer having a first wire material whose side surface is covered with a wire material diffusion preventing film;

a step of forming a first interlayered insulating film on said wire layer;

a step of forming an etching stopper film on said interlaminar insulating layer;

a step of forming a second interlayered insulating film on said etching stopper film;

a step of coating a first resist on said second interlayered insulating film, patterning said first resist at the upper portion of said first wire material by a lithography method, using said patterned first resist as a mask, and etching-removing said second interlayered insulating film by using the anisotropic etching until said etching stopper film is exposed, thereby forming a first wiring groove in said second interlayered insulating film;

a step of forming a first wire material diffusion preventing film on the upper surface of said second interlayered insulating film and on the inner surface of said first wiring groove after removing said first resist;

a step of coating a second resist on said first wire material diffusion preventing film, patterning said second resist in said first wiring groove by the lithography method, using said patterned second resist as the mask, and removing said first wire material diffusion preventing film portion of said first wiring groove bottom portion, said etching stopper film and said wire material diffusion preventing film portion covering the upper surface of said first interlayered insulating film and said first wire material, exposing said first wire material, thereby forming an connecting hole;

a step of forming a second wire material diffusion preventing film at least on a surface of said first wire material diffusion preventing film, on a side surface of said connecting hole and on an upper surface of said first wire material;

a step of removing said second wire material diffusion preventing film portion on the upper surface of said first wire material by using the anisotropic method, while remaining a second wire material diffusion preventing film portion on the side surface of said connecting hole and on a side surface of said first wiring groove; and a step of embedding a second wire material in said connecting hole and said first wiring groove.

12. A method of manufacturing a semiconductor device according to claim 11, wherein said step of forming said wire layer comprising:

a sub-step of forming a second wiring groove in a third interlayered insulating film by using the lithography method and the anisotropic etching method;

a sub-step of forming a first wire material whose only surface contacted to said second wiring groove of said first wire material is covered with a third wire material diffusion preventing film when said first wire material is embedded in said second wiring groove; and a sub-step of forming a fourth wire material diffusion preventing film on an upper surface of said third interlayered insulating film and on an upper surface of said first wire material embedded in said second wiring groove.

13. A method of manufacturing a semiconductor device according to claim 11, wherein said step of forming said wire layer comprising:

a sub-step of forming a second wiring groove in a third interlayered insulating film by using the lithography method and the anisotropic etching method;

a sub-step of forming a third wire material diffusion preventing film on an inner surface of said second wiring groove and on an upper surface of said third interlayered insulating film;

a sub-step of forming said first wire material on an upper surface of said first wire material diffusion preventing film;

a sub-step of removing back said cladded third wire material diffusion preventing film and said first wire material by first removing back means until said third interlayered insulating film is exposed, and simultaneously removing back a part of a third wire material diffusion preventing film portion in said second wiring groove and a part of said first wire material;

a sub-step of forming a fourth wire material diffusion preventing film on an upper surface of said third wire material diffusion preventing film portion in said second wiring groove whose a part is removed and said first wire material whose a part is removed; and a sub-step of removing back said fourth wire material diffusion preventing film portion by second removing back means until said third interlayered insulating film is exposed, and remaining said fourth wire material diffusion preventing film in only said wiring groove.

14. A method of manufacturing a semiconductor device according to claim 13, wherein said first and second removing back means is a chemical etching method using an activator.

15. A method of manufacturing a semiconductor device according to claim 13, wherein said second removing back means is a polishing method.

16. A method of manufacturing a semiconductor device according to claim 11, wherein said etching stopper film comprises a silicon nitride.

17. A method of manufacturing a semiconductor device comprising:

a step of forming a wire layer having a first wire material whose periphery is covered with a first wire material diffusion preventing film via an insulating layer on a semiconductor substrate;

a step of forming a first interlayered insulating film, a second wire material diffusion preventing film having an opened region where a connecting hole is to be formed and a second interlayered insulating film having the insulation characteristic on said wire layer;

a step of forming a first wiring groove in said second interlayered insulating film;

a step of removing said first wire material diffusion preventing film portion covering said first interlayered insulating film and an upper surface of said first wire material via an opened region in said second wire material diffusion preventing film at a bottom portion of said first wiring groove, and exposing said first wire, thereby forming an connecting hole;

a step of forming a third wire material diffusion preventing film on a surface of said second wire material diffusion preventing film, an inner side surface of said connecting hole, an upper surface of said first wire material and a surface of said second interlayered insulating film;

a step of removing said third wire material diffusion preventing film on the upper surface of said first wire material, while remaining said third wire material diffusion preventing film on the side surface of said connecting hole and on a side surface of said first wiring groove; and a step of embedding a second wire material in said connecting hole and said first wiring groove.

18. A method of manufacturing a semiconductor device according to claim 17, wherein said step of forming said wire layer comprising:

a sub-step of forming a second wiring groove in a third interlayered insulating film by using the lithography method and the anisotropic etching method; and a sub-step of covering a side surface of said first wire material with a third wire material diffusion preventing film when a first wire material is embedded in said second wiring groove.

19. A method of manufacturing a semiconductor device according to claim 17, wherein said step of forming said wire layer comprising:

a sub-step of forming a second wiring groove in a third interlayered insulating film by using the lithography method and the anisotropic etching method;

a sub-step of forming a second wire material diffusion preventing film on an inner surface of said second wiring groove and an upper surface of said third interlayered insulating film;

a sub-step of forming said first wire material on the upper surface of said first wire material diffusion preventing film, removing back said second wire material diffusion preventing film and said first wire material until said third interlayered insulating film is exposed by the first removing back means, and simultaneously removing a first wire material diffusion preventing film in said second wiring groove and a part of said first wire material; and a sub-step of forming a third wire material diffusion preventing film on an upper surface of a second wire material diffusion preventing film in said second wiring groove whose at least a part is removed and said first wire material, and removing back said third wire material diffusion preventing film until said third interlayered insulating film is exposed by using the second removing back means, while remaining said third wire material diffusion preventing film in only said wiring groove.

20. A method of manufacturing a semiconductor device according to claim 19, wherein said first and second removing back means is a chemical etching method using an activator.

21. A method of manufacturing a semiconductor device according to claim 19, wherein said second removing back means is a polishing method.

22. A method of manufacturing a semiconductor device according to claim 17, wherein said etching stopper film comprises a silicon nitride.

23. A method of manufacturing a semiconductor device wherein a wire layer having a wire whose side surface is covered with a wire material diffusion preventing film is formed via an interlayered insulating film, a method of manufacturing a contact hole for connecting said wires comprising:

a step of forming a wire layer having a first wire material whose side surface is covered with a wire material diffusion preventing film;

a step of forming a first interlayered insulating film on said wire layer;

a step of forming an etching stopper having a copper diffusion preventing function on said interlayered insulating film;

a step of coating a first resist on said etching stopper film, patterning said first resist at an upper portion of said first wire material by using the lithography method, using said patterned first resist all as the mask, and removing back said etching stopper film by using the anisotropic etching method, thereby forming a pattern for forming an connecting hole;

a step of forming a second interlayered insulating film in said pattern for forming the connecting hole and a main surface of said etching stopper film after removing said first resist;

a step of coating a second resist on said second interlayered insulating film, patterning said second resist at least at an upper portion of said pattern for forming the connecting hole by using the lithography method, using said patterned second resist as the mask, and removing back said second interlayered insulating film, thereby forming a first wiring groove, using said etching stopper film patterned for forming the connecting hole and said patterned second resist as the mask, removing back a wire material diffusion preventing film covering said interlayered insulating film and an upper surface of said first wire material, to expose said first wire material, thereby forming an connecting hole;

a step of forming a first wire material diffusion preventing film on an inner surface of said first wiring groove, on an upper surface of said second interlayered insulating film, on a side surface of said connecting hole and on an upper surface of said exposed first wire material after removing said patterned second resist;

a step of removing said first wire material diffusion preventing film on the upper surface of said second interlayered insulating film and on the upper surface of said first wire material by using the anisotropic etching method; and a step of embedding a second wire material in said connecting hole and said first wiring groove.

24. A method of manufacturing a semiconductor device according to claim 23, wherein said step of forming said wire layer comprising:
- a sub-step of forming a second wiring groove in a third interlayered insulating film by using the lithography method and the anisotropic etching method; and
- a sub-step of covering a side surface of said first wire material with a third wire material diffusion preventing film when a first wire material is embedded in said second wiring groove.

25. A method of manufacturing a semiconductor device according to claim 23, wherein said step of forming said wire layer comprising:
- a sub-step of forming a second wiring groove in a third interlayered insulating film by using the lithography method and the anisotropic etching method;
- a sub-step of forming a second wire material diffusion preventing film on an inner surface of said second wiring groove and an upper surface of said third interlayered insulating film;
- a sub-step of forming said first wire material on the upper surface of said first wire material diffusion preventing film, removing back said second wire material diffusion preventing film and said first wire material until said third interlayered insulating film is exposed by the first removing back means, and simultaneously removing a first wire material diffusion preventing film in said second wiring groove and a part of said first wire material; and
- a sub-step of forming a third wire material diffusion preventing film on an upper surface of a second wire material diffusion preventing film in said second wiring groove whose at least a part is removed and said first wire material, and removing back said third wire material diffusion preventing film until said third interlayered insulating film is exposed by using the second removing back means, while remaining said third wire material diffusion preventing film in only said wiring groove.

26. A method of manufacturing a semiconductor device according to claim 25, wherein said first and second removing back means is a chemical etching method using an activator.

27. A method of manufacturing a semiconductor device according to claim 25, wherein said second removing back means is a polishing method.

28. A method of manufacturing a semiconductor device according to claim 23, wherein said etching stopper film comprises a silicon nitride.

29. A method of manufacturing a semiconductor device for electrically connecting a first metal wire and a second metal wire formed in different layers of a multi-layer wire structure on a substrate to each other comprising:
- a step of forming said first metal wire whose periphery is covered with a first film;
- a step of forming an interlayered insulating film having a wiring groove on said first metal wire;
- a step of forming a second film on a surface of said interlayered insulating film;
- a step of forming a connecting hole extended from a bottom portion of said wiring groove to said first metal wire;
- a step of forming a third film at the bottom portion and a side surface of said wiring groove and at a bottom portion and a side surface of said connecting hole;
- a step of removing said third film portion on said connecting hole bottom portion to expose said first metal wire by using an anisotropic etching, while remaining said third copper diffusion preventing film portion on the side surfaces of said wiring groove and said connecting hole; and
- a step of forming said second metal wire which is electrically connected to said first metal wire by embedding a metal material in said wiring groove and said connecting hole,
- whereby said first metal wire and said second metal wire are directly connected to each other not via said third film portion on said contact hole bottom portion, while said metal material in said connecting hole is covered with said film portion on the side surface of said contact hole.

30. A method of manufacturing a semiconductor device, according to claim 29, said first and second metal wires are copper wires, and said first, second and third films are copper diffusion preventing films.

31. A method of manufacturing a semiconductor device, according to claim 30, wherein said copper diffusion preventing films are a selected one from a group of amorphous titanium SiN, amorphous tungsten SiN, titanium nitride, tungsten, tantalum, niobium, and tantalum aluminium.

32. A method of manufacturing a semiconductor device, according to claim 29, said first and second metal wires are aluminium wires, and said first, second and third films are reflow increasing films of aluminium.

33. A method of manufacturing a semiconductor device, according to claim 32, wherein said reflow increasing film are a selected one from a group of amorphous titanium SiN, amorphous tungsten SiN, titanium nitride, tungsten, tantalum, niobium, and tantalum aluminium.

34. A method of manufacturing a semiconductor device for electrically connecting a first metal wire and a second metal wire formed in different layers of a multi-layer wire structure formed via respective insulating films on a substrate to each other comprising:
- a step of forming said first metal wire whose periphery is covered with a first film;
- a step of sequentially forming a first interlayered insulating film on said first metal wire and a second film having an opening and a second interlayered insulating film having a wiring groove within a region where a connecting hole is to be formed;
- a step of forming the connecting hole extended from a bottom portion of said wiring groove to said first metal wire via said opening of said second film;
- a step of forming a third film at the bottom portion and on a side surface of said wiring groove and at a bottom portion and on a side surface of said connecting hole;
- a step of removing said third film portion on said connecting hole bottom portion to expose said first metal wire by using the anisotropic etching, while remaining said third film portion on the side surfaces of said wiring groove and said connecting hole; and
- a step of forming said second metal wire which is electrically connected to said first metal wire by embedding metal material in said wiring groove and said connecting hole,
- whereby said first metal wire and said second metal wire are directly connected to each other not via said third film portion on said contact hole bottom portion, while said metal material in said connecting hole is covered with said third film on the side surface of said contact hole.

35. A method of manufacturing a semiconductor device, according to claim 34, said first and second metal wires are copper wires, and said first, second and third films are copper diffusion preventing films.

36. A method of manufacturing a semiconductor device, according to claim 35, wherein said copper diffusion preventing films are a selected one from a group of amorphous titanium SiN, amorphous tungsten SiN, titanium nitride, tungsten, tantalum, niobium, and tantalum aluminium.

37. A method of manufacturing a semiconductor device, according to claim 34, said first and second metal wires are aluminium wires, and said first, second and third films are reflow increasing films of aluminium.

38. A method of manufacturing a semiconductor device, according to claim 37, wherein said reflow increasing film are a selected one from a group of amorphous titanium SiN, amorphous tungsten SiN, titanium nitride, tungsten, tantalum, niobium, and tantalum aluminium.

39. A method of manufacturing a semiconductor device comprising:
- a step of forming a first metal wire whose periphery is covered with a first film via an insulating layer on a semiconductor substrate;
- a step of forming a first interlayered insulating film, a second film and a second interlayered insulating film having an insulation characteristic on said first metal wire;
- a step of forming a first wiring groove in said second interlayered insulating film, by selecting etching said second interlayered insulating film until said second film is exposed;
- a step of removing a portion of said second film at a bottom portion of said first wiring groove, said second film and said first film portion covering an upper surface of said first interlayered insulating film and said first metal wire, to expose said first metal wire, thereby forming an connecting hole;
- a step of forming a third film on a surface of said second film, on an inner side surface of said connecting hole and on an upper surface of said first metal wire;
- a step of removing said third film portion on the upper surface of said first metal wire, while remaining said third film portion on the side surface of said connecting hole and on the side surface of said first wiring groove; and
- a step of embedding a second metal wire in said connecting hole and said first wiring groove.

40. A method of manufacturing a semiconductor device, according to claim 39, said first and second metal wires are copper wires, and said first, second and third films are copper diffusion preventing films.

41. A method of manufacturing a semiconductor device, according to claim 40, wherein said copper diffusion preventing films are a selected one from a group of amorphous titanium SiN, amorphous tungsten SiN, titanium nitride, tungsten, tantalum, niobium, and tantalum aluminium.

42. A method of manufacturing a semiconductor device, according to claim 39, said first and second metal wires are aluminium wires, and said first, second and third films are reflow increasing films of aluminium.

43. A method of manufacturing a semiconductor device, according to claim 42, wherein said reflow increasing film are a selected one from a group of amorphous titanium SiN, amorphous tungsten SiN, titanium nitride, tantalum, niobium, and tantalum aluminium.

* * * * *